US012211911B2

United States Patent
Metz et al.

(10) Patent No.: US 12,211,911 B2
(45) Date of Patent: Jan. 28, 2025

(54) RECESSED CONTACT STRUCTURES AND METHODS

(71) Applicant: Tokyo Electron Limited, Tokyo (JP)

(72) Inventors: Andrew Metz, Albany, NY (US); Caitlin Philippi, Albany, NY (US); Sophie Thibaut, Allbany, NY (US)

(73) Assignee: Tokyo Electron Limited, Tokyo (JP)

( * ) Notice: Subject to any disclaimer, the term of this patent is extended or adjusted under 35 U.S.C. 154(b) by 621 days.

(21) Appl. No.: 17/494,460

(22) Filed: Oct. 5, 2021

(65) Prior Publication Data

US 2022/0231138 A1 Jul. 21, 2022

Related U.S. Application Data

(60) Provisional application No. 63/234,987, filed on Aug. 19, 2021, provisional application No. 63/138,120, filed on Jan. 15, 2021.

(51) Int. Cl.
*H01L 29/417* (2006.01)
*H01L 29/40* (2006.01)
*H01L 29/66* (2006.01)

(52) U.S. Cl.
CPC ...... *H01L 29/41791* (2013.01); *H01L 29/401* (2013.01); *H01L 29/41733* (2013.01); *H01L 29/66742* (2013.01); *H01L 29/66795* (2013.01)

(58) Field of Classification Search
CPC ............. H01L 29/401; H01L 29/41733; H01L 29/41791; H01L 29/42392; H01L 29/66742; H01L 29/66795; H01L 29/78696

USPC ......................................................... 257/401
See application file for complete search history.

(56) References Cited

U.S. PATENT DOCUMENTS

| | | | |
|---|---|---|---|
| 9,847,390 B1 | 12/2017 | Xie et al. | |
| 10,074,727 B2 | 9/2018 | Adusumilli et al. | |
| 10,832,907 B2 | 11/2020 | Cheng et al. | |
| 10,903,077 B2 | 1/2021 | Yoshida et al. | |
| 2019/0267463 A1 | 8/2019 | Chao et al. | |
| 2021/0384306 A1* | 12/2021 | Xie | ................... H01L 29/66439 |
| 2022/0238660 A1* | 7/2022 | Huang | .............. H01L 29/66439 |

OTHER PUBLICATIONS

Lapedus, Mark, "New Transistor Structures At 3nm/2nm," Semiconductor Engineering, Jan. 25, 2021, https://semiengineering.com/new-transistor-structures-at-3nm-2nm/#comment-667724, 10 pages.
Loubet, N. et al., "Stacked Nanosheet Gate-All-Around Transistor to Enable Scaling Beyond FinFET," 2017 Symposium on VLSI Technology Digest of Technical Papers, Jun. 2017, 2 pages.

* cited by examiner

*Primary Examiner* — Fazli Erdem
(74) *Attorney, Agent, or Firm* — Oblon, McClelland, Maier & Neustadt, L.L.P.

(57) ABSTRACT

An exemplary method of forming a semiconductor device includes forming, in a substrate, an active region protruding vertically from a major surface of the substrate, the active region including a semiconductor source-drain (S/D) region and a first 3-D channel structure, the S/D region physically contacting the first 3-D channel structure, and forming an opening extending into the S/D region, the opening having a depth greater than half of a height of the first 3-D channel structure; and forming a metallic plug in the opening, the metallic plug making electrical contact with the S/D region.

20 Claims, 24 Drawing Sheets

RECESSED CONTACT STRUCTURES AND METHODS

CROSS-REFERENCE TO RELATED APPLICATIONS

This application claims the benefit of U.S. Provisional Application No. 63/138,120, filed on Jan. 15, 2021, and U.S. Provisional Application No. 63/234,987, filed on Aug. 19, 2021, which applications are hereby incorporated herein by reference.

TECHNICAL FIELD

The present invention relates generally to a structure and method for fabricating semiconductor devices, and, in particular embodiments, to recessed contact structures and methods for fabricating semiconductor devices.

BACKGROUND

A semiconductor device such as an integrated circuit (IC) is a monolithic structure comprising an integrated network of electronic components and multiple levels of interconnect. Generally, the device is fabricated by sequentially depositing and patterning dielectric, metal, and semiconductor layers over a semiconductor substrate to form circuit components such as transistors, resistors, and capacitors, and connectors such as contacts, metal lines, and vias. At each new technology node, the feature sizes are shrunk, roughly doubling the packing density to reduce cost and increase functionality of IC's. Enabled by innovations such as self-aligned double and quadruple patterning (SADP and SAQP), extreme ultraviolet (EUV) lithography, atomic level deposition and etch (ALD and ALE), area selective deposition (ASD), and self-aligned processes (e.g., self-assembled monolayers (SAM)), the patterns in advanced IC's have features down to about ten nanometers. But, miniaturization also increases electric fields in a field-effect transistor (FET). Hence, the supply voltage is periodically reduced to meet transistor reliability and leakage constraints, which adversely affects the drive capability per unit area.

A three-dimensional (3-D) channel structure, for example, a fin-shaped FinFET or a vertical stack of nanosheets of a gate all-around (GAA) FET is used to recover the drive current. Typically, the source-drain (S/D) of a 3-D FET are raised semiconductor regions formed along two opposite sides of the 3-D channel structure, with the S/D contacts made to a top surface of the S/D. In such architecture, the transistor current has to flow vertically through the raised S/D to access the 3-D channel structure. For a transistor array drawn at a minimum pitch, this vertical flow must squeeze through a narrow cross-section because the space for S/D contacts between adjacent gates is barely a few nanometers in an advanced IC design. Constricting the S/D cross-section in the path of the current causes a sharp increase in series resistance that may limit the drive current of a 3-D FET. Incorporating a wrap-around contact (WAC) provides partial relief by forming a metal liner wrapping around the bottom and sides of the S/D, but at the cost of an expensive and complex process flow. Novel contact structures and methods to further reduce parasitic series resistance of a 3-D FET may be beneficial for continued scaling.

SUMMARY

A method of forming a semiconductor device, the method includes: forming, in a substrate, an active region protruding vertically from a major surface of the substrate, the active region including a semiconductor source-drain (S/D) region and a first 3-D channel structure, the S/D region physically contacting the first 3-D channel structure, and forming an opening extending into the S/D region, the opening having a depth greater than half of a height of the first 3-D channel structure; and forming a metallic plug in the opening, the metallic plug making electrical contact with the S/D region.

A method of forming a semiconductor device, the method includes: forming a plurality of nanosheets including a first nanosheet and a second nanosheet, each of the plurality of nanosheets having a horizontal central plane and spaced apart from one another in a vertical direction; forming a source-drain (S/D) region at a distal end of each of the plurality of nanosheets; from a major surface of the S/D region, forming an opening extending through the horizontal central planes of the first and the second nanosheets into the S/D region; and filling the opening with a metal to make electrical contact with the first and the second nanosheets through the S/D region.

A semiconductor device includes: an active region protruding vertically from a major surface of a substrate, the active region including a semiconductor source-drain (S/D) region and a first 3-D channel structure, the S/D region physically contacting the first 3-D channel structure, and an opening extending into the S/D region, a bottom of the opening being below the first 3-D channel structure; and a metallic plug disposed in the opening, the metallic plug being electrically coupled to the S/D region.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
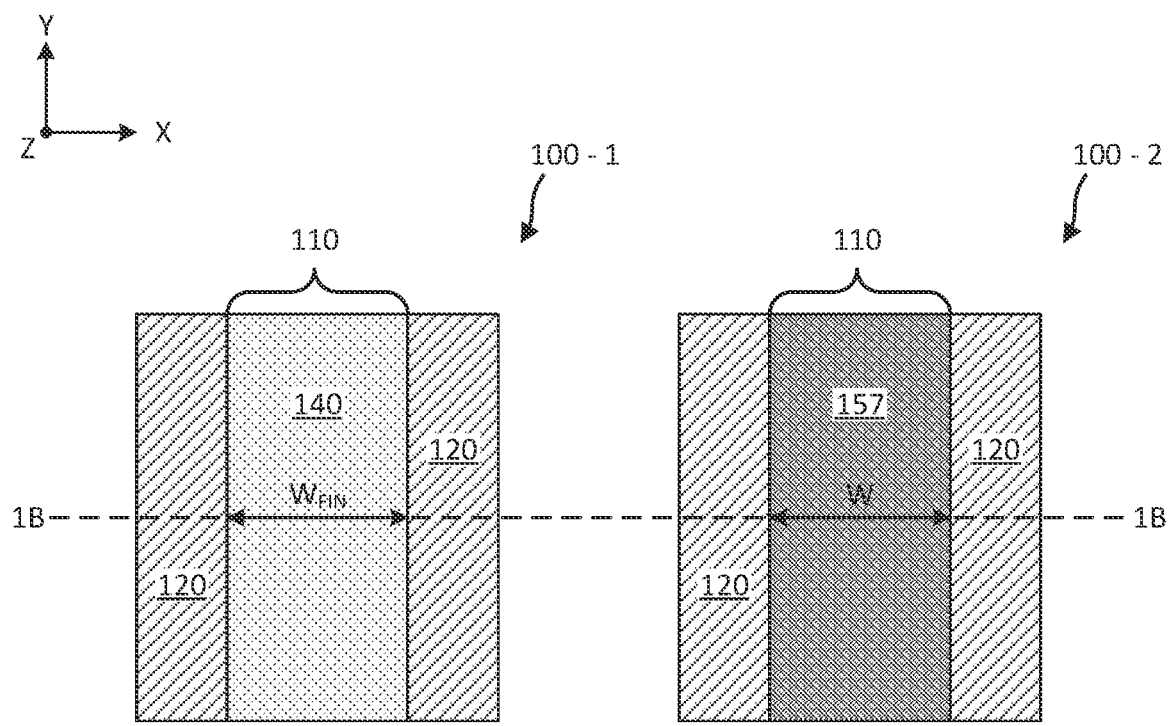
FIG. 1A illustrates planar views of a FinFET and a GAAFET in an intermediate stage of fabrication, in accordance with an embodiment.

This disclosure describes embodiments of a method of fabricating 3-D field-effect transistors (FET's) in which contacts to a source/drain (S/D) region are made using a novel recessed contact architecture where a contact metallization feature is formed in the semiconductor material of the S/D of an FET. Use of the embodiments described in this disclosure provides the advantage of achieving densely packed 3-D FET's without a high penalty in increased parasitic S/D resistance in series with the 3-D channel structure. Example fabrication methods for forming the novel contact structures with a self-aligned contact (SAC) process flow are provided. As described in further detail below, the fabrication methods utilize a relatively low-cost and low-complexity sequence of process steps that have demonstrated manufacturability.

As explained above in the background section, the transistor current in 3-D FET's (used in several advanced complementary metal oxide semiconductor (CMOS) technologies) flows vertically through raised S/D regions that are barely a few nanometers wide. The conductivity of even a heavily doped and strained semiconductor (e.g., carbon-doped silicon and embedded silicon-germanium) is low relative to that of most metals. Thus, for conventional contact architecture, where the contact metallization terminates on a top surface of the S/D, the parasitic S/D resistance in series with the transistor channel is very high. Even in WAC architecture, where much complex processing is performed to add a metal liner around the periphery of the S/D region, the S/D resistance persists being undesirably high. An IR voltage drop in the extrinsic S/D resistance subtracts from the power supply voltage ($V_{CC}$) in driving the intrinsic device. With $V_{CC}$ scaled down to about 1 V, S/D resistance may very well be the limiting constraint for the current-drive capacity of the device. The voltage loss gets worse for the portions of the 3-D channel structure that are further from the metal contact.

Embodiments of a novel contact architecture are described in this disclosure that provide a low resistance path in close proximity to the entire channel structure along the vertical dimension of the S/D. The low resistance path is a recessed metal feature in the S/D, formed by extending a contact opening from a top surface of the S/D region to a depth substantially close to the deepest portion of the channel structure and subsequently filling the opening with metal. This metallic extension of the conventional S/D contact structure may be fabricated using, for example, a conventional SAC flow with relatively minor modifications, as described in further detail below. The recessed S/D contact architecture provides low-cost methods that not only improve the total drive current but also results in distributing the current more evenly along the height dimension of a 3-D channel structure.

The recessed S/D contact structure and method is presented in the context of the GAAFET, which is likely be the transistor structure of choice for sub-5 nm CMOS nodes and is expected to benefit by using the embodiments described in this disclosure.

The GAAFET has a 3-D channel structure comprising a vertically arranged stack of, generally, three to five tiers of discrete nanosheets through which the channel current flows horizontally between distally located S/D regions at two opposing ends. Each nanosheet is a sheet of semiconductor having a horizontal central plane and a thickness or height dimension, H, that is typically about 3 nm to 10 nm in the direction normal to the central plane. Of the two nanosheet dimensions in the central plane, a length dimension, L, refers to a distance separating the distal S/D regions in a direction parallel to the channel current and a width dimension, W, refers to a lateral dimension perpendicular to the length direction. A transistor's gate region is generally a multi-layered stack including a high dielectric constant (high-k) gate dielectric and a metal gate electrode, usually referred to as an HKMG gate. The HKMG gate of the GAAFET wraps around each nanosheet and connects to columnar HKMG regions along the two opposing sides of the nanosheet that are orthogonal to the sides having the S/D regions.

In a fabrication process flow of a semiconductor device, the transistor structure is formed from a starting semiconductor substrate using a sequence of process steps, generally referred to as the front-end-of-line (FEOL). In this disclosure, a description of an example FEOL that may be used in constructing a GAAFET is provided with reference to FIG. 1A through FIG. 4. The transistor structure is, typically, covered from the top by insulators prior to forming electrical contacts to the S/D and the gate electrodes.

A sequence of process steps used in forming the contacts is usually referred to as the middle-of-line (MOL). In this disclosure, various example embodiments of structures and methods for forming a recessed S/D contact to S/D regions of GAAFET's are described with reference to FIGS. 5A-8F. A rectangular X-Y-Z coordinate system is shown in the figures to indicate the relative directions of the planes along which the planar and cross-sectional views of the structure are illustrated. Planes parallel to a horizontal major surface of the substrate is referred to as the X-Y plane. Vertical cross-sectional views are along the X-Z plane or the Y-Z plane, with Z being the vertical direction orthogonal to the major surface of the substrate.

The recessed S/D contact methodology has been concisely stated in a flow diagram illustrated in FIG. 9.

FIG. 1A illustrates planar views (the X-Y plane) of two 3-D FET structures in an intermediate stage of fabrication. At this stage, the respective starting semiconductor substrates have been processed to form active regions no and isolation regions 120. The 3-D FET structure on the left side in FIG. 1A is a FinFET structure 100-1 and, the 3-D FET structure on the right side is a GAAFET structure 100-2. The active regions no are, generally, patterned in long parallel lines. These active regions no comprise semiconductor materials used subsequently in the construction of the 3-D transistor structures. The active pattern has been formed during prior processing using, for example, a self-aligned double patterning (SADP) technique such as sidewall image transfer (SIT) to etch a pattern of recesses into a starting semiconductor substrate, thereby forming semiconductor protrusions from the substrate 130, as seen in the cross-sectional views illustrated in FIG. 1B. The semiconductor substrate for the FinFET structure 100-1 comprises a homogeneous semiconductor material (e.g., crystalline silicon). In contrast, the substrate for the GAAFET structure 100-2 includes a vertically layered heterostructure 150 comprising alternating nanosheets of two different semiconductors (e.g., crystalline silicon and crystalline alloyed silicon-germanium), as understood from the cross-sectional views illustrated in FIG. 1B. The nanosheets 151, 153, 155, and 157 are sacrificial nanosheets (e.g., alloyed silicon-germanium) and the nanosheets 152, 154, and 156 are channel nanosheets (e.g., silicon) that may be used subsequently in forming a 3-D three-tiered channel of the GAAFET structure 100-2. The horizontal central planes, HP1, HP2, and HP3, passing through the channel nanosheets 156, 154, and 152, respectively are indicated by dashed lines in FIG. 1B. Accordingly, the active regions 110 visible in FIG. 1A are the top of a semiconductor fin 140 of the FinFET structure 100-1 and the top of a semiconductor sacrificial nanosheet 157 of the GAAFET structure 100-2.

In the example embodiments described in this disclosure, the sacrificial nanosheets 151, 153, 155, and 157 may be silicon-germanium nanosheets and the channel nanosheets 152, 154, and 156 may be silicon nanosheets.

The isolation regions 120 comprise insulating regions disposed along opposing sides of the active regions 110 separating adjacent active regions 110. The semiconductor region below a major surface of the isolation region is referred to as the semiconductor substrate 130. For example, the semiconductor region below the heterostructure 150 and the semiconductor region below a top portion of the fin 140 have been included in semiconductor substrate 130 for simplicity.

The active regions 110 and the isolation regions 120 may be formed using a shallow trench isolation (STI) method. In the STI method, first the starting semiconductor substrate is patterned to recess the semiconductor surface to a desired depth, as mentioned above. In some embodiments, an anisotropic etching process such as reactive ion etching (RIE) may be performed with a patterned hard mask formed using, for example, a self-aligned double patterning (SADP) method, as mentioned above. For the FinFET structure 100-1, the recess extends beyond the bottom of an active channel region, indicated in FIG. 1B by a dotted line in fin 140. For the GAAFET structure 100-2, the recess extends beyond the bottom of the heterostructure 150. The recesses may then be filled by depositing an insulator (e.g., silicon oxide) and planarized using, for example, chemical mechanical polishing (CMP) to remove excess insulator from over the semiconductor surface. The insulating portion of the planarized surface may be etched back using, for example, a timed etch process to expose the active channel region of fin 140 in the FinFET structure 100-1 and the heterostructure 150 in the GAAFET structure 100-2. The etchback process places the bottom of the recesses in a horizontal plane, thereby exposing the 3-D channel structures. It is noted that the etchback places the major surface of the isolation region 120 substantially close to the bottom of the heterostructure 150.

Figure 1B:
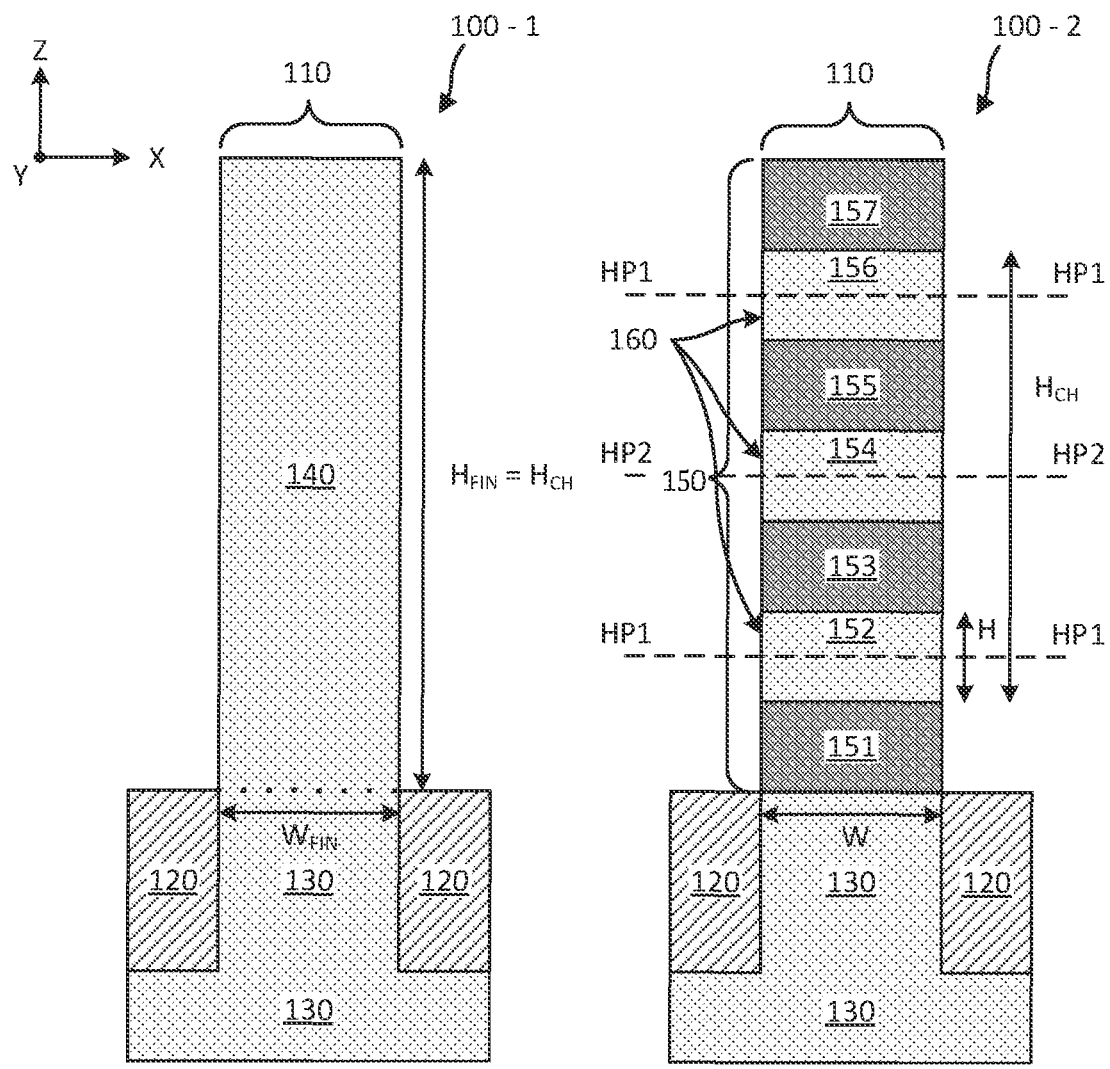
FIG. 1B illustrates cross-sectional views of the FinFET and the GAAFET illustrated in FIG. 1A.

The 3-D channel structure of the FinFET structure 100-1 (illustrated in FIG. 1B) is the single fin 140 protruding above the major surface of the isolation region 120. However, the 3-D channel structure 160 of the GAAFET structure 100-2 comprises the three channel nanosheets 152, 154, and 156, as illustrated in FIG. 1B. The height dimension of the 3-D channel structure, $H_{CH}$, may be the vertical distance from the lowest level of a semiconductor channel to the highest level of a semiconductor channel included in the 3-D channel structure, as illustrated in FIG. 1B.

It is noted that in a FinFET structure, such as the FinFET structure 100-1, the bottom of the active channel region is at a level coplanar with a major surface the isolation region 120. Hence, a height dimension, $H_{FIN}$, of the channel region of the FinFET structure 100-1 is a vertical distance between the top of fin 140 and the level of the major surface of the isolation region 120, as illustrated in FIG. 1B. As indicated in FIG. 1B, the height, $H_{CH}$, of the 3-D channel structure of the FinFET structure 100-1 is same as the height dimension of the fin 140, $H_{FIN}$. The heterostructure 150 of the GAAFET structure 100-2 may be construed as a composite channel region comprising three tiers of channel nanosheets 152, 154, and 156, each having a height dimension, H, that is typically between 3 nm to 10 nm, as mentioned above. The 3-D channel structure 160 of the GAAFET structure 100-2 comprises the three channel nanosheets 152, 154, and 156. The combined height of these and the two sacrificial nanosheets 153 and 155 separating the middle channel nanosheet 154 from the lowest channel nanosheet 151 and the highest nanosheet 157 is the height, $H_{CH}$, of the 3-D channel structure 160 of the GAAFET structure 100-2, or, $H_{CH}$ would be the combined heights of five nanosheets 152, 153, 154, 155, and 156, as indicated in FIG. 1B. The FinFET structure 100-1 may be construed as having a 3-D channel structure that has a single fin 140. So, the 3-D channel structure of the FinFET structure 100-1 has a height dimension, $H_{CH}$ equal to $H_{FIN}$. The height, $H_{FIN}$, of the homogeneous channel region of fin 140 and the height, $H_{CH}$, of the 3-D channel structure 160 of the GAAFET structure 100-2 may be between about 30 nm to about 100 nm. The channel region of the FinFET structure 100-1 (fin 140) has a width dimension, $W_{FIN}$, and the channel nanosheets 152, 154, and 156 have a width, W. Both $W_{FIN}$ and W are determined from the width of the active region no lines, as shown in FIGS. 1A and 1B. From the geometry of the structures, it is apparent that the transistor current for the GAAFET structure 100-2 scales more rapidly with increasing width of the active region no relative to the scaling of transistor current with width for the FinFET structure 100-1. Typically, $W_{FIN}$ of the FinFET structure 100-1 may be from about 3 nm to about 10 nm, and W of the GAAFET structure 100-2 may be from about 7 nm to about 100 nm.

The rest of this disclosure describes several example embodiments of the recessed S/D contact in the context of the GAAFET only. However, it is understood that the recessed S/D contact may be implemented for FinFET's and GAAFET's using similar processes and structures.

Figure 2A:
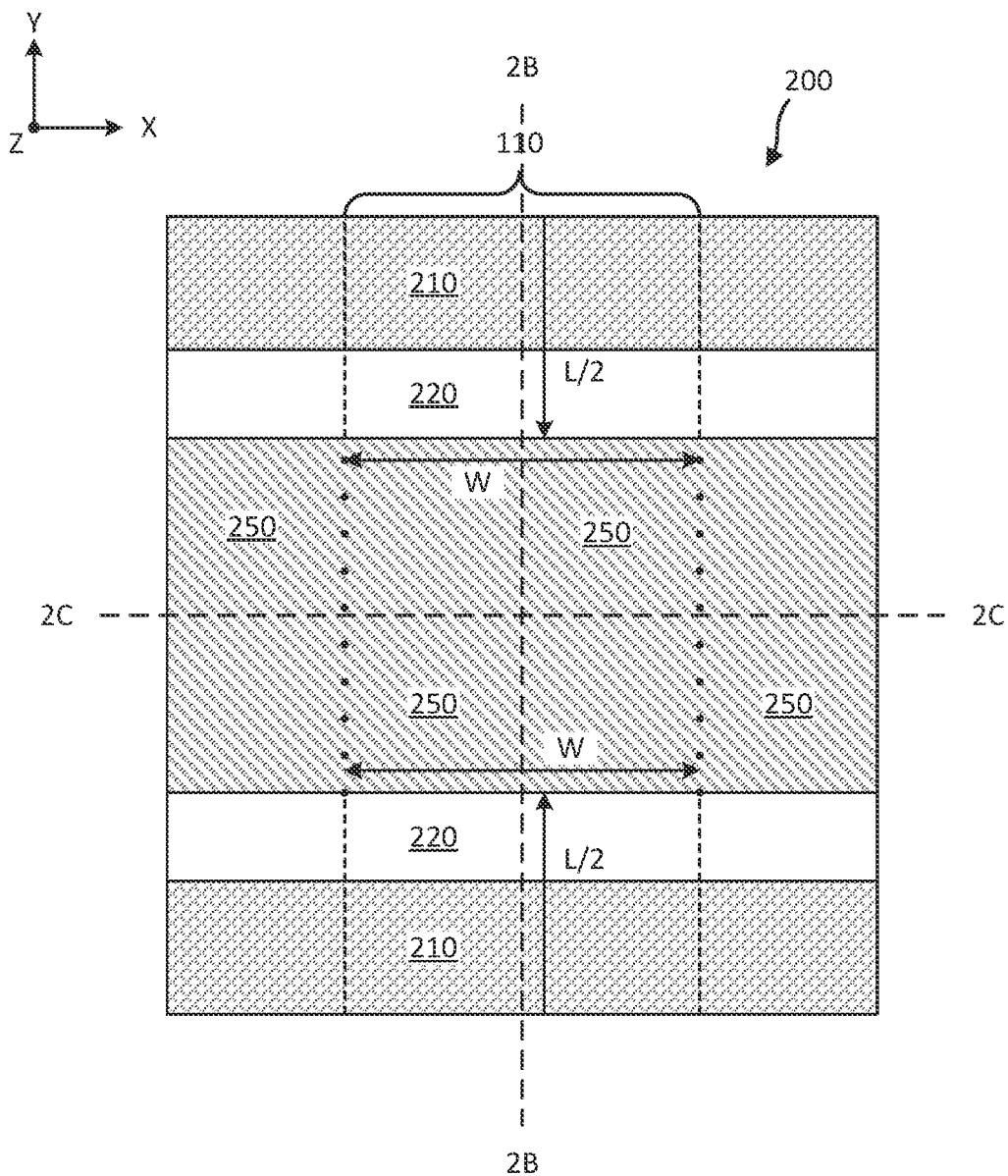
FIG. 2A illustrates a planar view of a GAAFET in an intermediate stage of fabrication, in accordance with an embodiment.
Figure 2B:
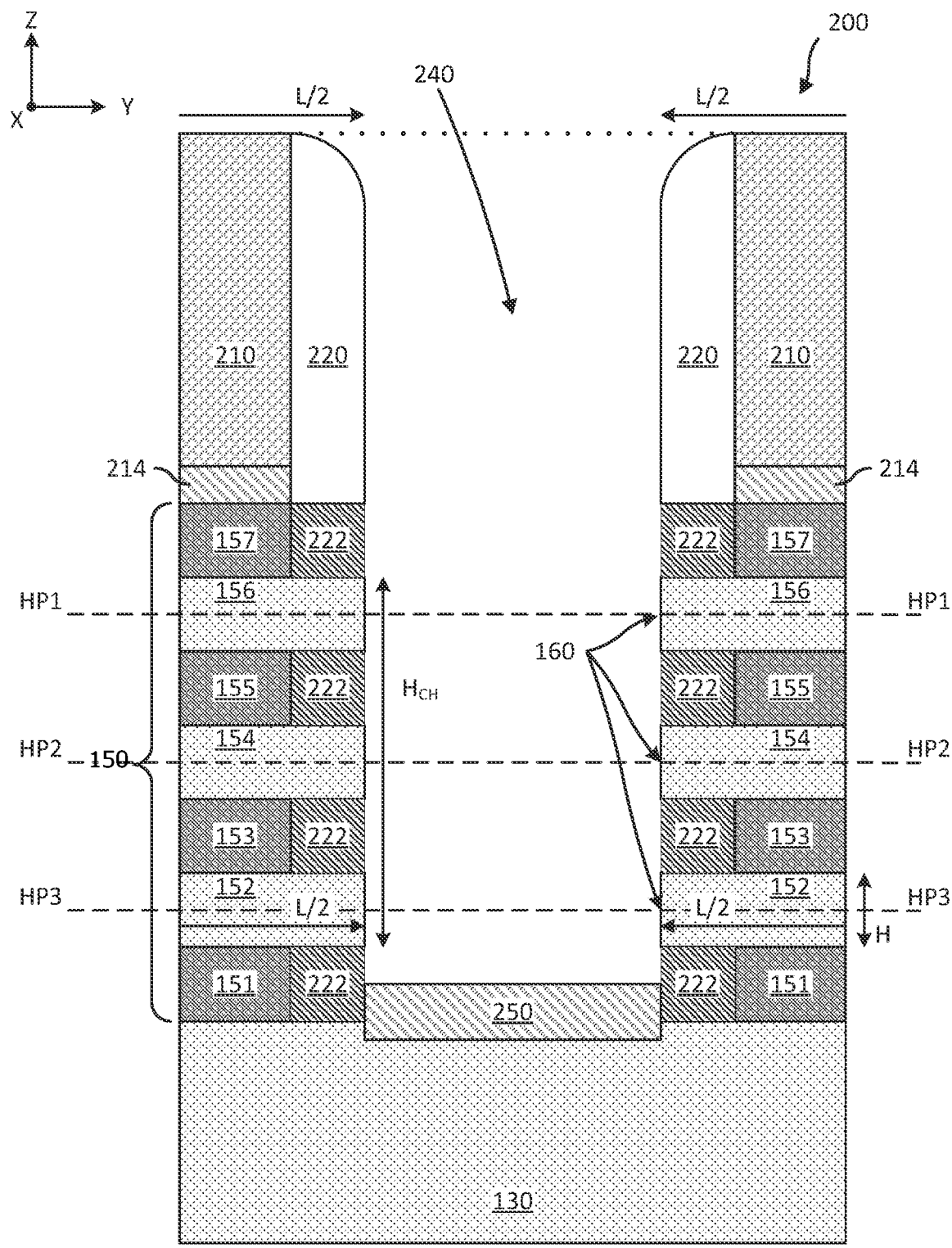
FIGS. 2B and 2C illustrate two orthogonal cross-sectional views of the GAAFET illustrated in FIG. 2A.
Figure 2C:
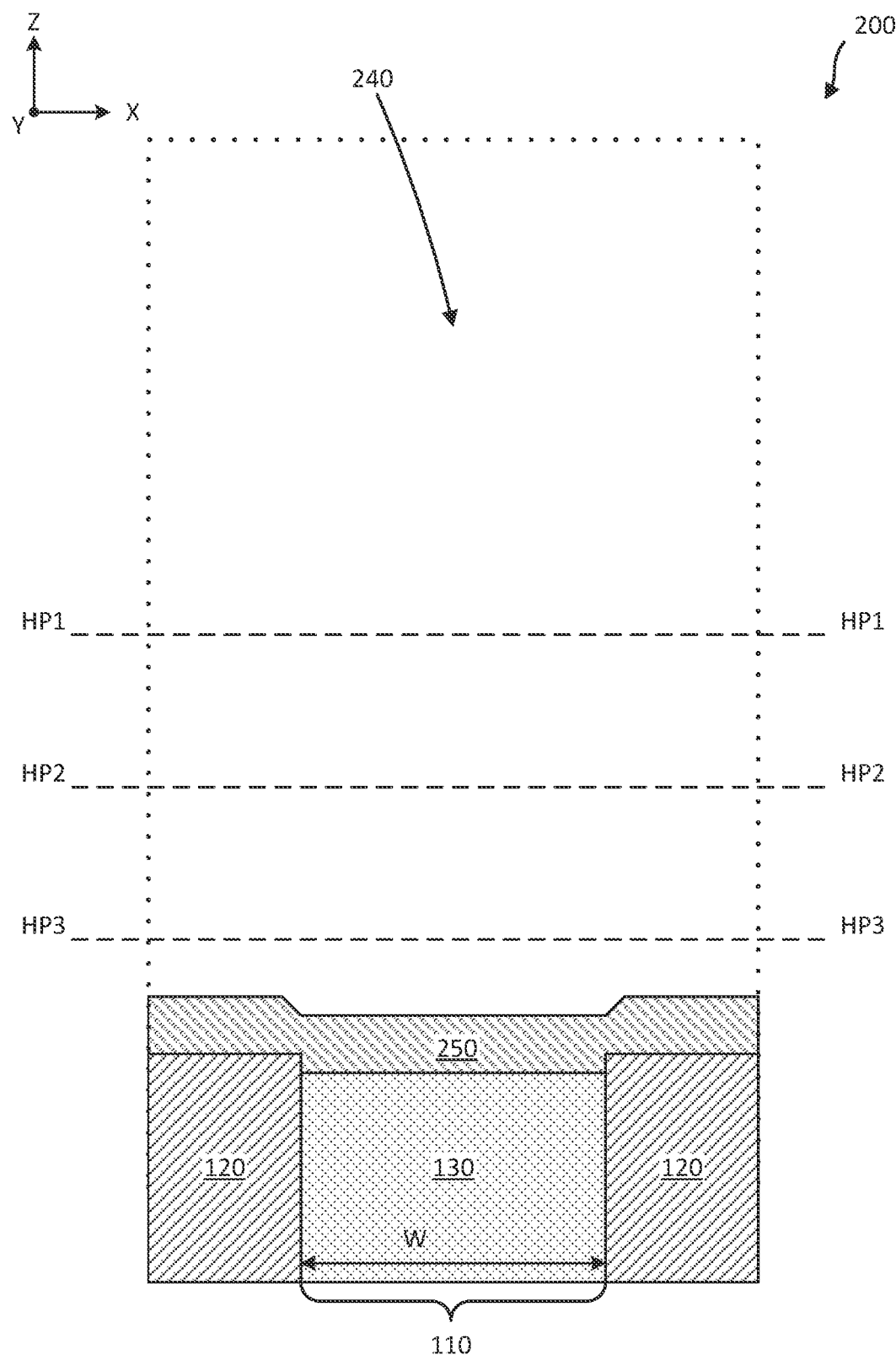

In some embodiments, the GAAFET is fabricated using a replacement metal gate (RMG) method. In the RMG method, first a sacrificial gate structure is fabricated after forming the isolation regions 120. A sidewall structure is formed around the sacrificial gate structure, and the combined sacrificial gate and sidewall structures are used to define self-aligned channel, S/D, and gate regions of the GAAFET. FIGS. 2A-2C illustrate various views of an example GAAFET structure 200 after the sacrificial gate and the sidewall structures 220 have been patterned. The gate pattern and the active pattern together define the channel and S/D regions. Two adjacent sacrificial gate structures are shown in FIGS. 2A-2C but, since the gate structures are symmetrical, only one half of each gate has been drawn. For example, FIG. 2A shows two gate half-lines drawn in the X-direction, one half-line in the upper part of the schematic and the other half-line in lower part of the schematic. During subsequent processing, the S/D and the recessed S/D contact would be formed in a region between the two gate half-lines.

As illustrated in the planar view (X-Y plane) in FIG. 2A and the cross-sectional view (Y-Z plane) in FIG. 2B, the sacrificial gate structure has been formed by depositing and patterning a sacrificial gate stack using suitable deposition and lithography techniques. In some embodiment, the sacrificial gate stack may comprise a sacrificial gate dielectric layer 214 (e.g., silicon oxide) and a sacrificial gate electrode layer 210 (e.g., amorphous silicon) deposited over the sacrificial gate dielectric layer 214. In some embodiment, the deposited sacrificial gate electrode layer 210 is planarized prior to patterning. In the example embodiment, the sacrificial gate electrode layer 210, for example, the amorphous silicon is not covered by a capping layer. In some other embodiment, there may be a capping layer over the gate electrode layer 210. A sidewall structure 220 is shown at the periphery of the patterned sacrificial gate structure. In some embodiment, the sidewall structure 220 may be formed by a self-aligned spacer technique, where spacer material may be deposited conformally and, subsequently, an anisotropic etch (e.g., RIE) may be used that removes the spacer material selective to the semiconductors in the active region no and the insulators in the isolation region 120. In various embodiments, the sidewall structure 220 may comprise silicon nitride, or a silicon nitride based material having a dielectric constant less than that of silicon nitride (e.g., SiCN, SiBCN, and SiOCN), or some other dielectric having a similarly low dielectric constant.

Typically, the features of the sacrificial gate pattern are shaped like lines that are orthogonal to the active region 110, as illustrated in the planar view in FIG. 2A where two half-lines of the top surface of the sacrificial gate electrodes 210 are visible. FIG. 2A further illustrates that the patterned features of the sacrificial gate electrode 210 combined with the sidewall structure 220 comprises regions that overlap the active region no having a width, W, indicated by the dashed lines and the double arrow.

FIGS. 2B and 2C illustrate that, in some embodiment, the combined sacrificial gate electrode 210 and the sidewall structure 220 may be used as a patterned hard mask for a sequence of anisotropic etch processes to remove the heterostructure 150 from over the portion of the elongated active area no between adjacent sidewall structures 220, thereby forming an extended recess 240. The sequence of anisotropic etch processes may be selective to the insulator (e.g., silicon oxide) of the isolation region 120 and, furthermore, be designed to stop on the underlying substrate 130 (e.g., silicon substrate), exposing a portion of a surface of substrate 130 in the elongated active region no when the heterostructure 150 is removed. In some embodiment, the surface of substrate 130 is slightly recessed.

Removing the heterostructure 150 self-aligned to the sidewall structures 220, defines a self-aligned channel region comprising the channel nanosheets 152, 154, and 156 in the remaining portions of the heterostructure 150. The horizontal central planes, HP1, HP2, and HP3, illustrated in FIG. 1B, are shown also in FIGS. 2B and 2C by dashed lines. In FIG. 2B, the intersections of the horizontal central planes, HP1, HP2, and HP3 with the channel nanosheets 156, 154, and 152, respectively are visible. In FIG. 2C, the intersections are not visible because the heterostructure 150 has been removed self-aligned to the sidewall structures 220. The self-aligned etch also defines the length dimension, L, in the Y-direction, that is orthogonal to the direction of the width dimension (X-direction). The length, L, of the channel nanosheets is indicated by two arrows marked L/2 in the two sacrificial half-gates in FIGS. 2A and 2B.

In this disclosure, we refer to an area as a disjoint S/D active section if the area is an active region and if there is no gate structure formed over that section of the active region. For example, as illustrated in FIG. 2A, the section of the active region 110 that was previously occupied by the heterostructure 150 and is bounded by edges of the sidewall structures 220 on two sides parallel to the X-direction and by edges of the isolation region 120 on two sides parallel to the Y-direction, is a disjoint S/D active section. In the length direction (Y-direction in FIG. 2A), adjacent disjoint S/D active sections are generally separated by the multi-tiered 3-D heterostructure 150 of the GAAFET (or a fin-shaped channel of a FinFET). In the width direction (X-direction in FIG. 2A), adjacent disjoint S/D active sections are generally separated by isolation regions 120.

As explained in further detail below, the semiconductor material of the S/D regions may be deposited in the disjoint S/D active sections by epitaxial growth from exposed surfaces of the channel nanosheets 152, 154, and 156, exposed along sidewalls of the recess 240 in the vertical X-Z plane. The S/D region originating from a disjoint S/D active section may merge with adjacent S/D regions to form an elongated S/D region extending over several adjacent disjoint S/D active sections in the width direction (X-direction in FIG. 2A), as explained further below.

As understood from the cross-sectional view of the Y-Z plane illustrated in FIG. 2B, a vertical surface of the heterostructure 150 (in the X-Z plane) is exposed along the sidewall of the recess 240. After removing a portion of the heterostructure 150 the sacrificial nanosheets 151, 153, 155, and 157 comprising, for example, silicon-germanium alloy, have been recessed by an amount substantially same as the thickness of the sidewall structures 220. The recesses may be formed using an appropriate isotropic etch process (e.g., a dry vapor etch) that may remove silicon-germanium selective to the other exposed materials. As illustrated in FIG. 2B, the recesses have been filled to form inner spacers 222 below the sidewall structures 220. The inner spacers 222 may be formed by first conformally depositing a dielectric using, for example, a conformal ALD process. The thickness of the deposited film is selected to roughly fill the recesses completely, for example, by depositing about half the thickness of the sacrificial nanosheets 151, 153, 155, and 157. After the conformal deposition is complete, an etchback process is performed using, for example, an isotropic dry vapor etch or a wet etch to remove the excess dielectric material selectively from over the sides of the channel nanosheets 152, 154, and 156, the sidewall structure 220, the top of the sacrificial gate electrodes 210, the bottom surface of recess 240, and the top of the isolation region 120. For etch selectivity, the dielectric material for the inner spacers 222 and the sidewall structure 220 are selected to be different although, in some embodiments, both may be selected from the same group of materials mentioned above (e.g., SiN, SiCN, SiBCN, and SiOCN).

In some embodiments, an optional insulating region may be formed over a portion of a major surface of the substrate 130, the optional insulating region being referred to as an insulating cover layer 250. In some embodiments, the insulating cover layer 250 may be formed over the bottom of the recess 240 to insulate the substrate 130 exposed by removing the heterostructure 150 between adjacent sidewall structures 220. In some other embodiments, the surface of the semiconductor substrate 130 at the bottom of the recess 240 may not be insulated from the subsequently formed S/D layers. In the example embodiment illustrated in FIGS. 2A-2C, the cover layer 250 covers the entire area between the adjacent sidewall structures 220. The cover layer 250 crosses over the boundary of the active region 110 indicated by the dotted lines in the space between the adjacent sidewall structures 220 in FIG. 2A. In another embodiment, the cover layer 250 may not be present over the isolation regions 120.

Figure 3A:
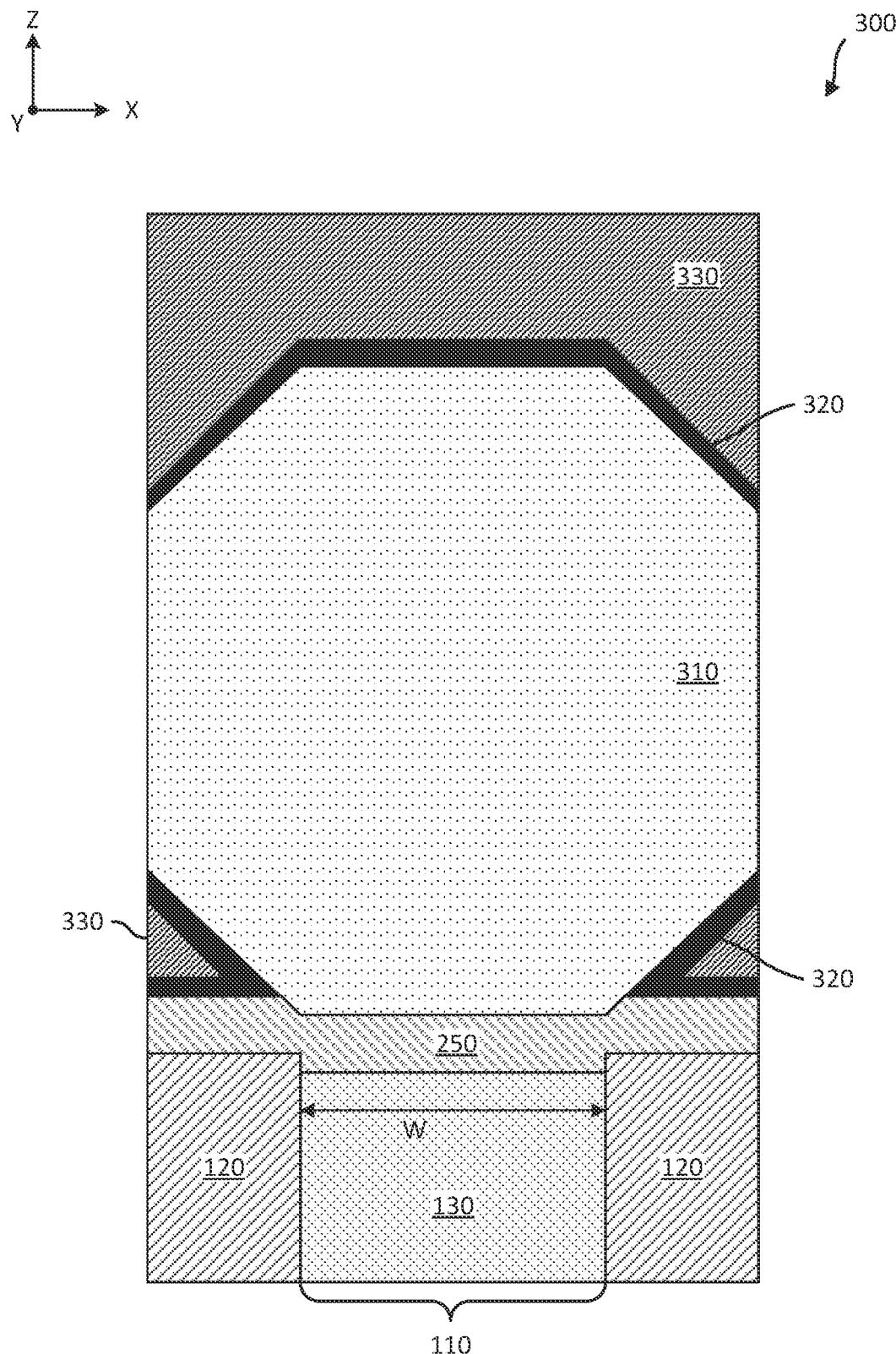
FIGS. 3A and 3B illustrate two orthogonal cross-sectional views of a GAAFET in an intermediate stage of fabrication, in accordance with an embodiment.
Figure 3B:
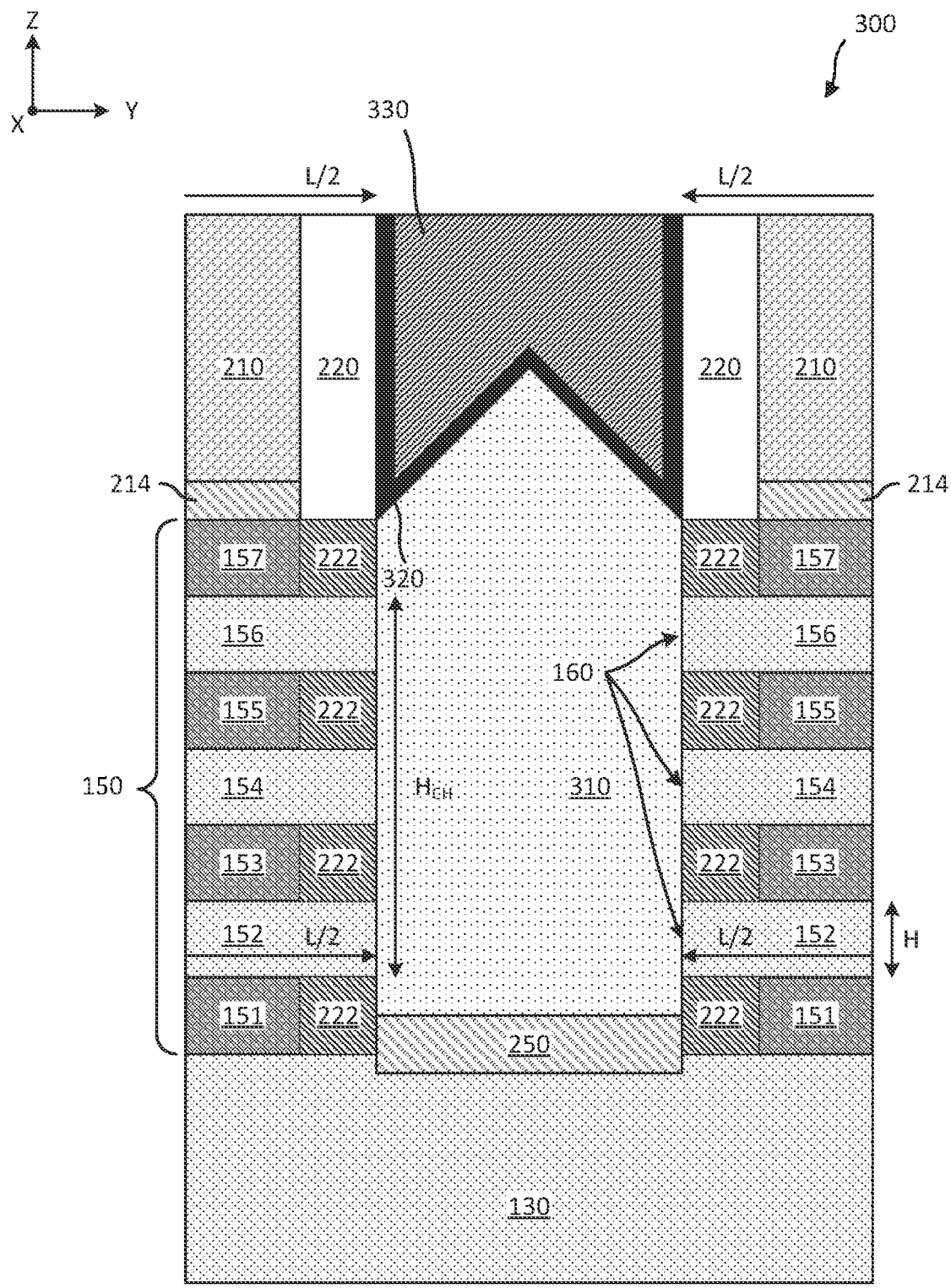

FIGS. 3A and 3B illustrate cross-sectional views of a GAAFET structure 300 after the epitaxially grown S/D layers 310 have been formed, a contact etch stop layer (CESL) 320 and a contact interlayer dielectric (ILD) 330 has been deposited. The contact ILD 330 has been planarized to expose a top surface of the gate electrode 210. FIG. 3A illustrates a cross-sectional view in the X-Z plane (the plane perpendicular to the direction of current flow and parallel to the sacrificial gate electrodes 210). FIG. 3B illustrates a cross-sectional view in the Y-Z plane (the plane parallel to the direction of current flow and perpendicular to the sacrificial gate electrodes 210).

It is noted (see FIG. 2B) that each of the channel nanosheets 152, 154, and 156 have an exposed surface in the X-Z plane, exposed along the sidewall of the recess 240. The S/D layers 310 may be formed by a selective epitaxial growth process that deposits crystalline semiconductor on the exposed surfaces of the channel nanosheets 152, 154, and 156. As illustrated in FIG. 3B, the epitaxial deposition has been continued for a sufficient time to allow the S/D material deposited on vertically adjacent channel nanosheets (e.g., channel nanosheets 152 and 154) to merge vertically (in the Z-direction) and form a vertically continuous S/D layer 310. Vertically, the S/D region extends above the topmost channel nanosheet 157 of the heterostructure 150. The top surface of the S/D layer 310 may be non-planar because of faceting during epitaxial growth.

In addition, in FIG. 3B, the epitaxial growth has also merged horizontally (in the Y-direction). In some designs, parallel lines of gate structures may be spaced by a distance substantially close (or equal) to the minimum space allowed by the design rules. In such embodiments, such as in the GAAFET structure 300 in FIG. 3B, the semiconductor material deposited in the disjoint S/D active section may merge laterally (in the Y-direction), filling the space between the heterostructures 150 of the two sacrificial half-gates.

FIG. 3A illustrates a cross-sectional view of the X-Z plane of the GAAFET structure 300 for a cut through the center of the disjoint S/D active section taken along the width direction. In this example embodiment, the semiconductor surface of substrate 130 is covered by the optional cover layer 250. The epitaxial growth from the channel nanosheets has progressed in the Y-direction to merge at the center (as seen in FIG. 3B). Accordingly, the epitaxially grown S/D layer 310 is visible in the cross-sectional view in FIG. 3A. The combined two cross-sectional views (FIGS. 3A and 3B) indicate that the illustrated disjoint S/D active section of the active region no of GAAFET 300 is entirely covered by the S/D region formed by, for example, selective epitaxial deposition. Generally, the design rules and the epitaxial growth process parameters are such that all the individual S/D active sections are entirely covered by the semiconductor material deposited to form the S/D region.

In addition to covering the disjoint S/D active region with the semiconductor S/D layer 310, the epitaxially grown S/D region covers a portion of the isolation region 120 adjacent to the disjoint S/D active region no. As seen in FIG. 3A, the epitaxial growth occurs also in the X-direction. The growth in the width direction (X-direction) elongates the S/D region to be wider than the width, W, of the active region no and extends the S/D layer 310 over the isolation region 120. As also seen in FIG. 3B, FIG. 3A shows facets formed along certain crystal directions during epitaxial growth, giving the S/D layer 310 a diamond-like shape.

In some designs, active regions, such as the active region no (see FIGS. 1A and 2A), may be drawn as parallel lines with spacing between the lines being at the minimum, or substantially close to the minimum width of an isolation region 120 allowed by the rules for the respective technology. In such embodiments, the epitaxially grown S/D layer 310 may extend over the isolation region 120 in the width direction (X-direction) and merge with similar epitaxially grown adjacent S/D regions to form a common S/D region. The common S/D region may go over several disjoint S/D active regions and isolation regions 120 in the width direction alongside a sidewall structure 220 of a gate region of a GAAFET structure. Typically, a second similar common S/D region would be formed alongside a sidewall structure 220 on the opposite side of the gate region.

The epitaxially grown S/D layer 310 is generally a heavily doped semiconductor layer. For an n-type FET, the S/D layer 310 may be phosphorus or arsenic doped silicon or silicon-carbon alloy to form a strained S/D layer 310 that may induce tensile strain in the channel nanosheets 152, 154, and 156 to enhance electron mobility. For a p-type FET, the S/D layer 310 may be boron doped silicon or silicon-germanium alloy to form a strained S/D layer 310 that may induce compressive strain in the channel nanosheets 152, 154, and 156 to enhance the mobility of holes.

In some embodiment, the CESL 320 may comprise silicon nitride and the contact ILD 330 may comprise silicon oxide or a low-k silicon oxide (e.g., CDO, fluorosilicate glass (FSG), a porous oxide, or the like). In various other embodiments, the CESL may comprise silicon carbide, aluminum oxide, or titanium dioxide. The contact ILD 330 is part of an interlayer dielectric through which a contact to the S/D region would be made subsequently, as described in further detail below. The deposited dielectric layers CESL 320 and contact ILD 330 may be etched back and planarized using a CMP process.

A S/D anneal step, for example, a rapid thermal anneal (RTA), may be performed to repair crystal defects, activate the dopants in the S/D layer 310, and diffuse some of the dopants into the channel nanosheets 152, 154, and 156 in the regions covered by the sidewall structure 220 and the inner spacers 222. The S/D anneal step helps reduce the parasitic S/D resistance in series with the 3-D channel structure.

As mentioned above, the GAAFET structure 300 illustrated in FIGS. 3A and 3B is formed by depositing the CESL 320 and the contact ILD 330 and etching back the surface till the sacrificial gate electrode layer 210 has been exposed. In some embodiments, where the contact ILD 330 comprises silicon oxide and the CESL layer 320 comprises silicon nitride, the silicon nitride serves as an initial CMP stop layer for the silicon oxide etchback process. After the processing steps used to form the GAAFET structure 300 have been completed, the RMG method proceeds to form the HKMG gate.

In the RMG method, the sacrificial gate stack comprising the sacrificial gate dielectric layer 214 and the sacrificial gate electrode layer 210 is removed and replaced with an HKMG gate. In some embodiment, the sacrificial gate stack may be removed in two steps. First, the sacrificial gate electrode layer 210 is removed selective to the sacrificial gate dielectric layer 214 and, subsequently, the sacrificial gate dielectric layer 214 is removed selective to the nanosheet heterostructure 150. The etch processes may be performed using suitable known etch chemistries and etching techniques. For example, in some embodiment, ammonium hydroxide or tetramethylammonium hydroxide (TMAH) wet etching or sulfur hexafluoride plasma dry etching may be used for removing amorphous silicon and, hydrofluoric acid (HF) wet etching or dry etching with HF vapor may be used for removing silicon oxide.

As mentioned above, each of the channel nanosheets 152, 154, and 156 in FIG. 3B of the GAAFET structure 300 has to be wrapped all around with the HKMG gate. The surfaces over which the HKMG gate would be formed is exposed using a channel nanosheet release etch step, performed to remove the sacrificial nanosheets 151, 153, 155, and 157 selectively. The etch chemistry is selected to provide high selectivity with respect to other materials that may be exposed to the etchants, for example, the materials used for the contact ILD 330, the sidewall structure 220, the channel nanosheets 152, 154, and 156, and the inner spacers 222. In some embodiment, the contact ILD 330 comprises a low-k silicon oxide, the sidewall structure 220 comprises silicon nitride, the inner spacers 222 comprises silicon carbonitride (SiCN), the channel nanosheets 152, 154, and 156 comprise silicon, and the sacrificial nanosheets 151, 153, 155, and 157 comprise silicon-germanium. The channel nanosheet release etch may be performed using, for example, a wet solution containing hydrogen peroxide or a dry vapor comprising hydrochloric acid. In some embodiment, the contact ILD 330 comprises silicon oxide, carbon-doped silicon oxide (CDO), fluorosilicate glass (FSG), or a porous oxide.

Figure 4:
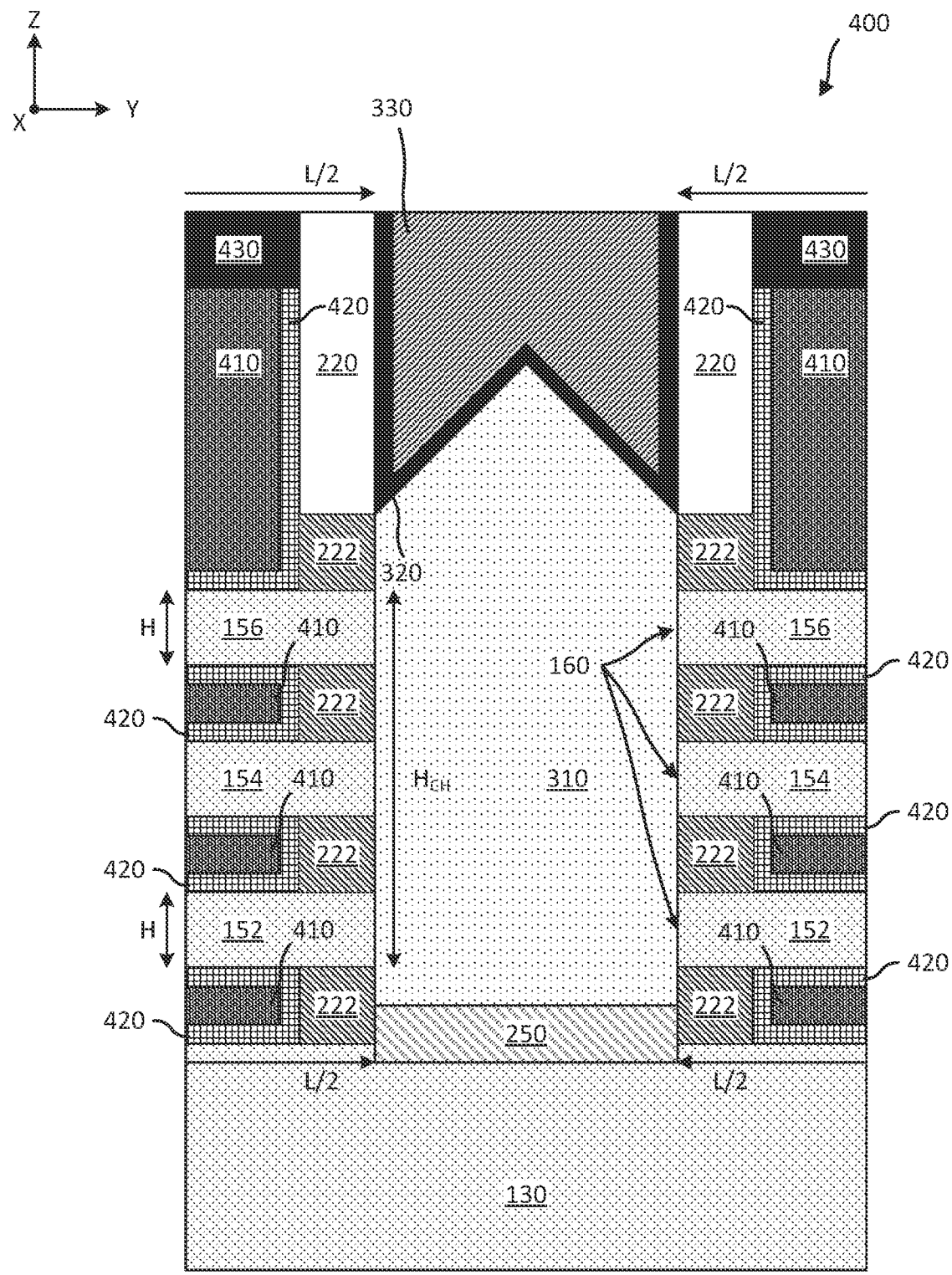
FIG. 4 illustrates a cross-sectional view of a GAAFET in an intermediate stage of fabrication, in accordance with an embodiment.

FIG. 4 illustrates a GAAFET structure 400, where the HKMG gate, comprising a high-k gate dielectric layer 420 (e.g., a hafnium oxide or a hafnium silicate) and a metal gate electrode layer 410, has been formed after removing the sacrificial layers, as described above.

The recesses formed by removing the sacrificial layers are filled with the HKMG gate. The high-k gate dielectric layer 420 is formed in adjacent to the channel nanosheets 152, 154, and 156 and the metal gate electrode layer 410 is formed over the high-k gate dielectric layer 420. The metal gate electrode layer 410 comprises a combination of several layers, including a workfunction metal layer formed in close proximity to the high-k gate dielectric layer 420. In some embodiments, the various layers for the HKMG gate may be formed using a highly conformal process such as ALD. A workfunction metal layer may also comprise several metal layers and may include metals such as titanium nitride, tantalum nitride, and metal alloys such as AlC, TiAl and TiAlC. The workfunction metal for an n-type FET is generally different from that for a p-type FET in order to select different threshold voltages for the different types of FET. Metal deposition is continued till the recesses are filled with excess metallic fill material. In some embodiments, the metallic fill material may be different from the workfunction materials and may comprise a low resistivity metal, for example, tungsten, copper, cobalt, and aluminum. In some embodiments, the space between vertically adjacent channel nanosheets may be pinched off by the workfunction metal layer prior to depositing the metallic fill material.

After depositing the metallic fill, excess metal is removed by a planarizing etchback process (e.g., a metal CMP process) down to the previously planarized level of the contact ILD 330 and the sidewall structures 220 (see FIG. 3B). The resulting top surface comprises a conductive portion comprising the metals used for the metal gate electrode 410 and a dielectric portion comprising the dielectric contact ILD 330, the tops of the sidewall structures 220 and the CESL 320 adjacent to the sidewall structure 220.

After planarization, a selective recess etch is used to recess the conductive portion of the surface, a capping dielectric (e.g., silicon nitride) is deposited conformally, and the capping dielectric is etched back using a planarization process to form a self-aligned contact (SAC) cap 430 inlaid between sidewall structures 220 over the tops of the gate electrode layer 410. The structure formed after the SAC cap CMP is the GAAFET structure 400, shown in cross-sectional view of the Y-Z plane illustrated FIG. 4. The cross-sectional view in FIG. 4 is along the same cut as used for FIG. 3B. The cross-sectional view of the GAAFET structure 400 in the X-Z plane is similar to that shown in FIG. 3A.

As illustrated in FIG. 4, the HKMG gate of the GAAFET wraps around each channel nanosheet 152, 154, and 156. The various gate electrodes 410 wrapping around the nanosheets in one vertical stack of nanosheets are connected to columnar HKMG regions along the two opposing sides of the nanosheet that are orthogonal to the sides adjacent to the S/D layer 310. The SAC cap 430 is used to protect the gate region of the GAAFET during subsequent contact open etch steps.

The channel region of the GAAFET structure 400 in FIG. 4 comprises the channel nanosheets 152, 154, and 156, each having a height, H, a width, W, and a length, L. In some embodiments, where the ratio W/L is relatively low (e.g., between 1 and 2) the nanosheet is referred to as a nanowire. Two sections of the S/D region formed by two vertically continuous S/D layers 310 may be disposed on two opposing sides of the HKMG gate. The HKMG gate and the S/D region are electrically isolated by the sidewall structures 220 and the inner spacers 222. A portion of the channel nanosheets 152, 154, and 156 covered from above and below by the inner spacers 222 and in the proximity of the S/D layer may be construed as drain extension regions because they contain dopants diffused in there from the S/D layer 310 during the S/D anneal step, as described above.

Next, the formation of various embodiments of the recessed S/D contact using the GAAFET structure 400 (illustrated in FIG. 4) as the incoming structure are described with reference to FIGS. 5A-8F. The contact-open etch processing for the various embodiments are described using FIGS. 5A-7D. The contact-open etch may be performed in three steps referred to as the first etch (SAC RIE), the second etch (CESL etch), and the third etch (recessed contact etch). A spacer deposition and spacer etch is performed after the first etch to form a spacer inside the partially open contact. The contact metallization processing for the various embodiments are described using FIGS. 8A-8F.

Figure 5A:
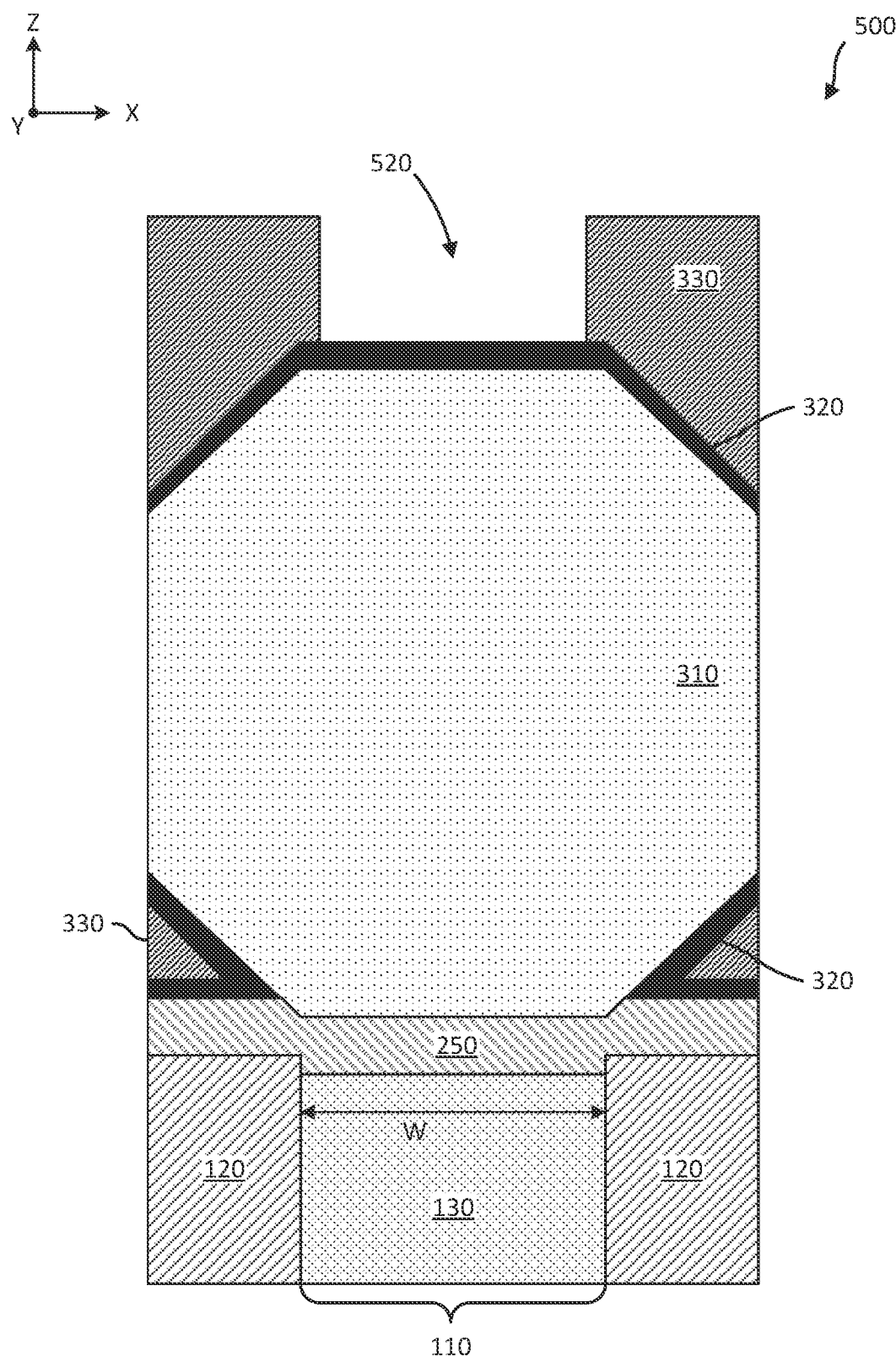
FIGS. 5A and 5B illustrate two orthogonal cross-sectional views of a GAAFET in an intermediate stage of fabrication, in accordance with an embodiment.
Figure 5B:
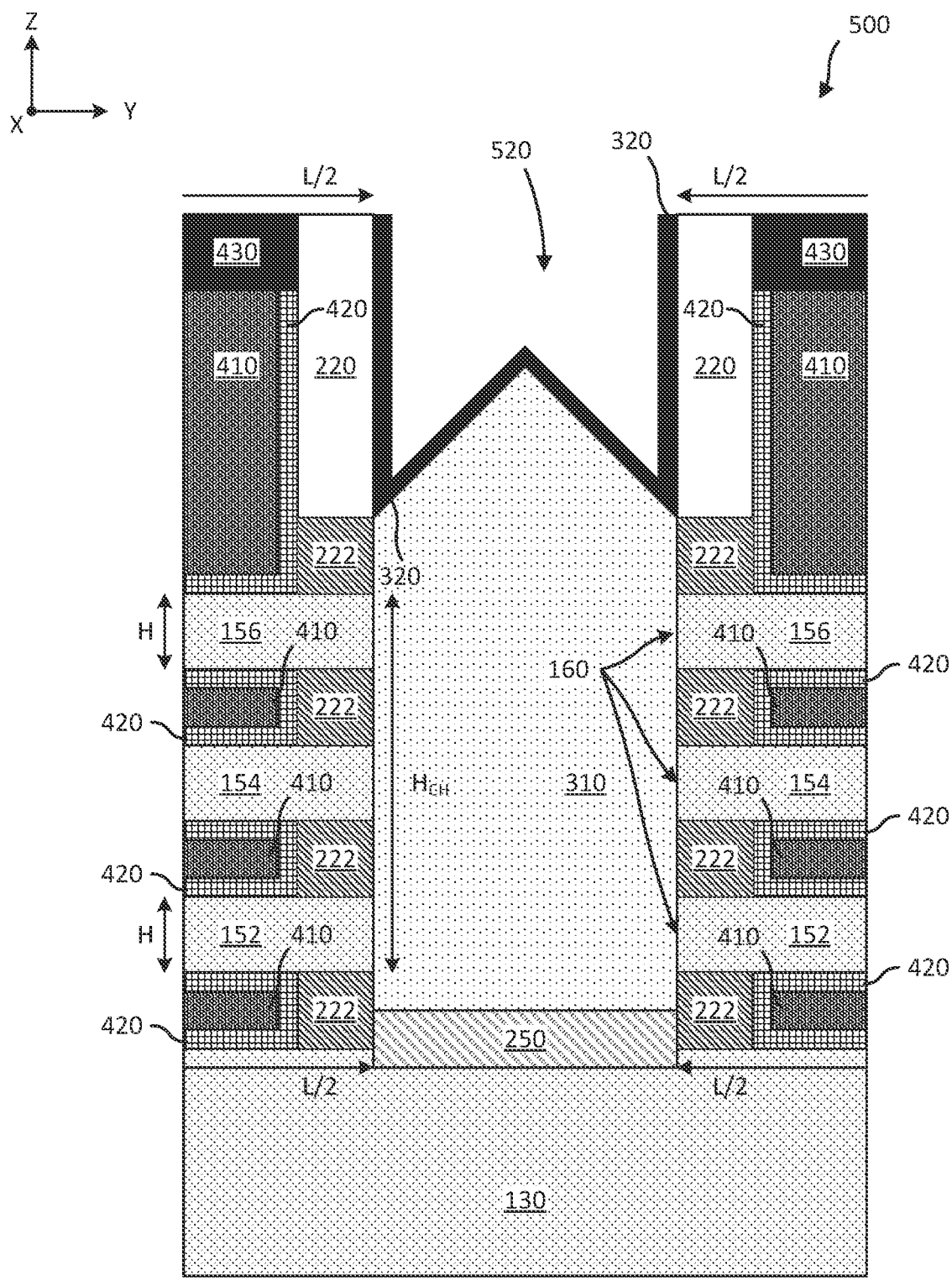

In the GAAFET structure 500 illustrated by FIGS. 5A and 5B, a contact opening 520 has been formed. The opening 520 may be formed similar to a conventional self-aligned contact (SAC) process. In some embodiment, the contact ILD 330 comprises silicon oxide or a low-k silicon oxide and the CESL 320, the SAC cap 430, and the sidewall structure 220 comprises silicon nitride or a similar material (e.g., SiCN, SiBCN, and SiOCN). The first etch removes silicon oxide (contact ILD 330) anisotropically selective to silicon nitride using, for example, an RIE process having a fluorine based etchant (e.g., $CF_4$, $CH_3F$, or $C_4F_8$) in a gaseous mixture comprising other gases such as argon and oxygen. Thus, if the space between adjacent GAAFET gates is smaller than the dimension of the S/D contact opening in the respective etch mask then the SAC cap 430 and the sidewall structure 220 may serve as the etch mask. FIG. 5B illustrates such an example. In FIG. 5B, the patterned opening in the etch mask (e.g., a patterned photoresist mask) being wider than the spacing between the adjacent sidewall structures 220, the first etch first removes silicon oxide and exposes a portion of the silicon nitride SAC cap 430 and sidewall structure 220. Similar to a conventional SAC RIE, the first etch has continued to remove the contact ILD (silicon oxide) self-aligned to the SAC cap 430 and the sidewall structure 220 (silicon nitride), eventually stopping on the CESL 320 to form the contact opening 520 having a width (in the Y-direction) roughly equal to a space between the sidewall structures 220, as illustrated in FIG. 5B. It is noted that, because of faceting during epitaxial growth of the S/D layer 310, the surface of the CESL 320 at the bottom of the contact opening 520 is not planar. The overetch portion of the first etch may be adjusted to expose the CESL 320 without leaving silicon oxide residues at the bottom corners of the contact opening 520.

As described above with reference to FIGS. 5A and 5B, the first etch exposes the CESL 320 at the bottom of the opening 520. The contact opening 520 is disposed directly over the disjoint S/D (see FIG. 2A), the disjoint S/D being the active region no between adjacent sidewall structures 220. The boundary of the active region no between adjacent sidewall structures 220 is indicated by dotted lines in FIG. 2A. In some embodiments, prior to removing the exposed CESL 320 and extending the contact opening 520 into the S/D layer 310, a thin layer of spacer material is deposited along the sidewalls of the contact openings 520 and etched using a suitable spacer etch process, as described in detail below.

Figure 6A:
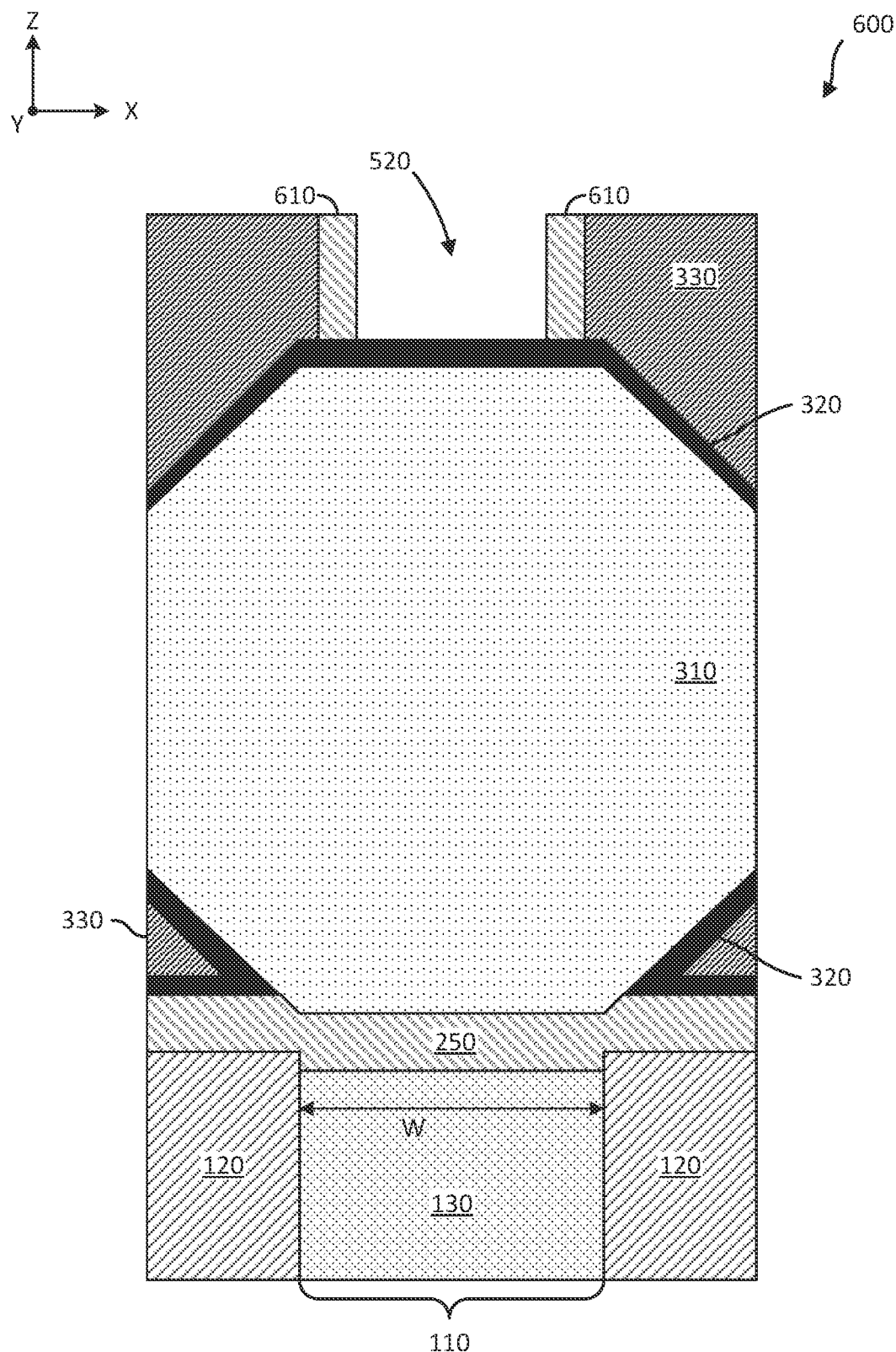
FIGS. 6A and 6B illustrate two orthogonal cross-sectional views of a GAAFET in an intermediate stage of fabrication, in accordance with an embodiment.
Figure 6B:
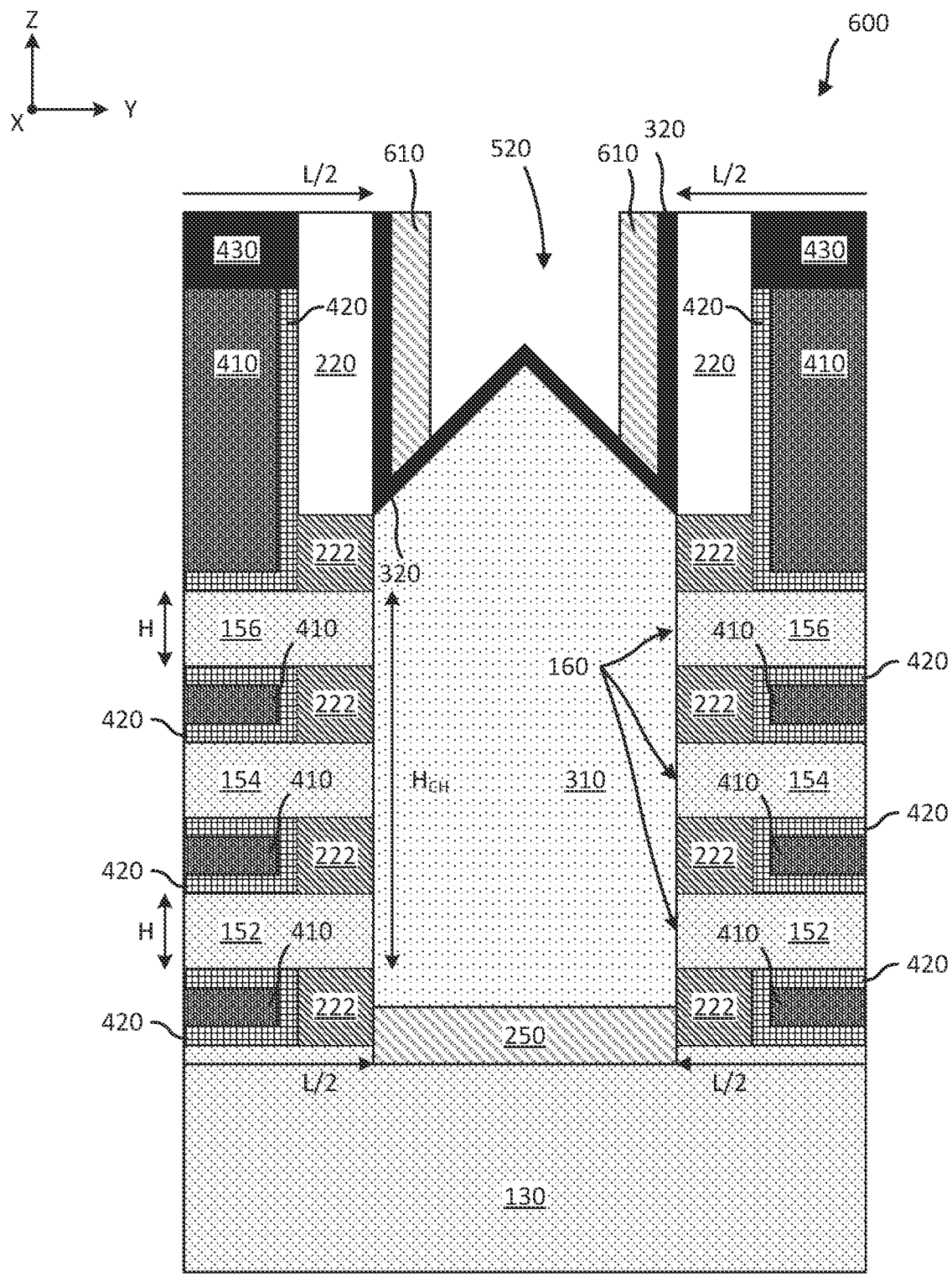

FIGS. 6A and 6B illustrate a GAAFET 600 including a spacer 610 using cross-sectional views in the X-Z and the Y-Z planes, respectively. In FIGS. 6A and 6B, a spacer 610 has been formed covering the sidewall of the contact opening 520 after completing the first etch process. Spacer 610 may be formed by depositing a spacer material that may be etched selectively to the semiconductor in the S/D layer 310 using, for example, a conformal ALD. In the example embodiment illustrated in FIGS. 6A and 6B, the S/D layer 310 may comprise silicon, silicon-carbon, or silicon-germanium alloy, and the spacer 610 may comprise silicon dioxide or silicon nitride. In some other embodiment, some other combination of materials may be used; for example, the spacer 610 may comprise a metal oxide or a metal. An anisotropic etch using fluorocarbon (e.g., $CF_4$), hydrofluorocarbon (e.g., $CH_3F$), or fluorine deficient fluorocarbon ($C_4F_8$) etch chemistry may be performed to form the spacer 610. In some embodiment, where the spacer 610 comprises silicon oxide, the spacer etch may stop on the CESL 320, and a second etch step performed to remove the CESL 320 to extend the contact opening 520 and expose a top surface of the S/D layer 310. In some other embodiment, where the spacer 610 comprises silicon nitride, the CESL 320 may be removed during the spacer etch, in which case a separate second etch step (the CESL etch) may be omitted. In some embodiments, the spacer 610 may be about 3 nm to about 15 nm wide, depending on the width of the opening 520. In either embodiment, the etch processes to form the spacer 610 and remove the CESL 320 exposes a top surface S/D layer 310 without excessive damage to the semiconductor material.

One advantage provided by the spacer 610 is that it better ensures that the lateral dimensions of the exposed surface of the S/D layer 310 are precisely controlled. As explained in further detail below, a controlled lateral spacing between the position of the opening and the nanosheets 152, 154, and 156 helps a leakage component of a GAAFET. Once the S/D layer 310 is exposed, a third etch process that removes a portion of the S/D layer 310 may be performed, as mentioned above and described in detail below.

Figure 7A:
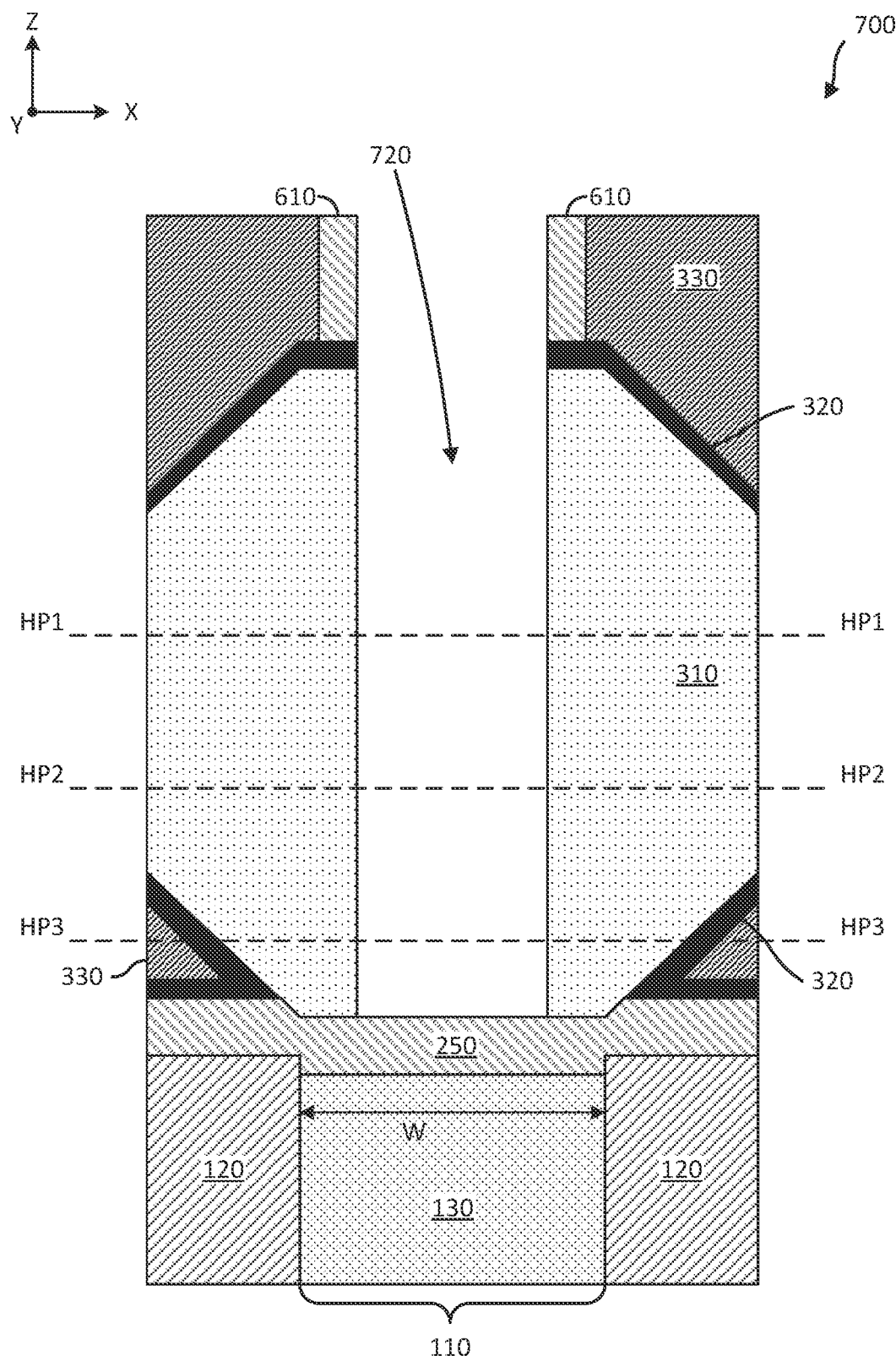
FIGS. 7A and 7B illustrate two orthogonal cross-sectional views of a GAAFET in an intermediate stage of fabrication, in accordance with an embodiment.
Figure 7B:
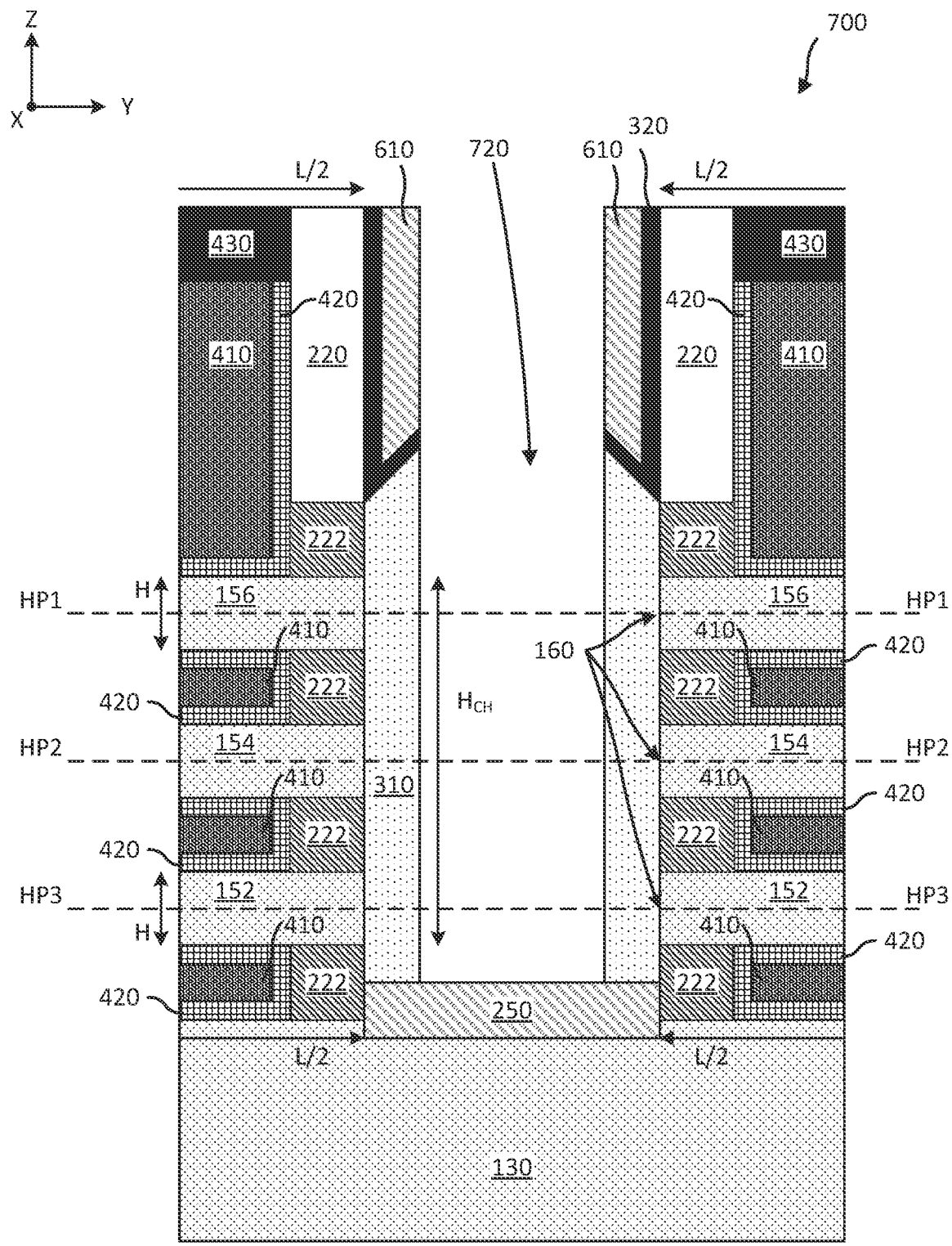

FIGS. 7A and 7B illustrate the example embodiment in a GAAFET structure 700 formed after a third etch process has extended the contact opening 520 to form the recessed contact opening 720. The third etch process may be performed to anisotropically remove semiconductor material from the S/D layer 310 to extend the contact opening further deep into the S/D region. A contact opening extending deep into the S/D region is referred to as a recessed contact opening, in this disclosure. The location of the bottom surface of the contact opening is generally deep enough to place the final metal contact along a majority of the 3-D channel structure. The depth of the recess in the S/D of a recessed contact opening exceeds half the height, $H_{CH}$ (see FIG. 7B), of the 3-D channel structure 160.

FIGS. 7A and 7B show the example recessed contact opening 720 has been formed extending through the horizontal central planes HP1, HP2, and HP3 of the channel nanosheets 156, 154, and 152, respectively. In the example embodiment illustrated in FIGS. 7A and 7B, the bottom of the contact opening 720 is an exposed top surface of the optional cover layer 250. As described above, the cover layer 250 is an optional insulating layer formed in an earlier process step (see FIGS. 2A-2C). One advantage of forming the cover layer 250 is that the third etch process may use the insulating cover layer 250 as an etch stop layer. This helps in preventing unintended damage to the silicon substrate 130 that may cause undesirable defects in the substrate 130 that result in electrical leakage current from the S/D layer 310 to the substrate 130. Accordingly, in the example embodiment illustrated in FIGS. 7A and 7B, the bottom of the recessed contact opening 720 is located at a depth that is insulated from the substrate by the insulating cover layer 250. Furthermore, this allows the contact metallization to reach a depth substantially close to the first horizontal level of the GAAFET (channel nanosheet 152).

In some embodiments, the semiconductor S/D layer 310 may comprise heavily doped n-type silicon or a silicon-carbon alloy for the n-type GAAFET's and heavily doped p-type silicon or a silicon-germanium alloy for the p-type GAAFET's. In some embodiments, the third etch may be simultaneously removing portions of the S/D layers 310 of the n-type GAAFET and the p-type GAAFET. In some other embodiments, additional masking steps may be inserted in the fabrication process flow to allow for the use of separate the etch processes for n-type and the p-type GAAFET's. This simplifies the process design for the third etch but at a higher processing cost. In the example embodiments in this disclosure, both types of GAAFET's are etched at the same time with an anisotropic RIE process using, for example, chlorine based or hydrogen bromide based etch chemistry along with an oxygen source (e.g., oxygen, carbon monoxide, or carbon dioxide) for passivating the sidewalls and an inert gas (e.g., argon or helium) for dilution.

In this embodiment, the third etch may be an endpoint etch using the insulating cover layer 250 as the etch stop layer. In some other embodiment, a timed third etch may be used, even if the cover layer 250 present. In some embodiments, where the optional cover layer 250 is not present, the third etch may be a timed etch, where the etch time is selected to prevent recessing the substrate 130. Generally, it is desirable to select an etch time for the timed etch processes such that the bottom of the recessed contact opening is positioned in a horizontal plane that is in the semiconductor S/D layer 310 but deeper than the top of the channel nanosheet 152 (the nanosheet closest to the substrate 130). In all embodiments, the recessed contact is formed to place the bottom of the contact at a depth greater than half the height, $H_{CH}$, of the 3-D channel structure.

As mentioned above, one advantage of forming the spacer 610 is that the lateral dimension of the contact opening 520 (see FIGS. 6A and 6B) and the recessed opening 720 may be precisely controlled. The spacer provides a well-controlled additional spacing between the recessed S/D contact metallization and the junction between the S/D region and the channel region formed in the channel nanosheets 152, 154, and 156 near the inside edge of the inner spacers 222. The additional spacing helps reduce the number of defects in the junction depletion region, thereby helping reduce junction leakage when the GAAFET is biased in its off state. It is noted that the advantages provided by forming the spacer are not lost if the spacer 610 is removed after the recessed opening 720 has been formed. Removing the spacer 610 to make a top portion of the contact wider may help reduce contact resistance.

Figure 7C:
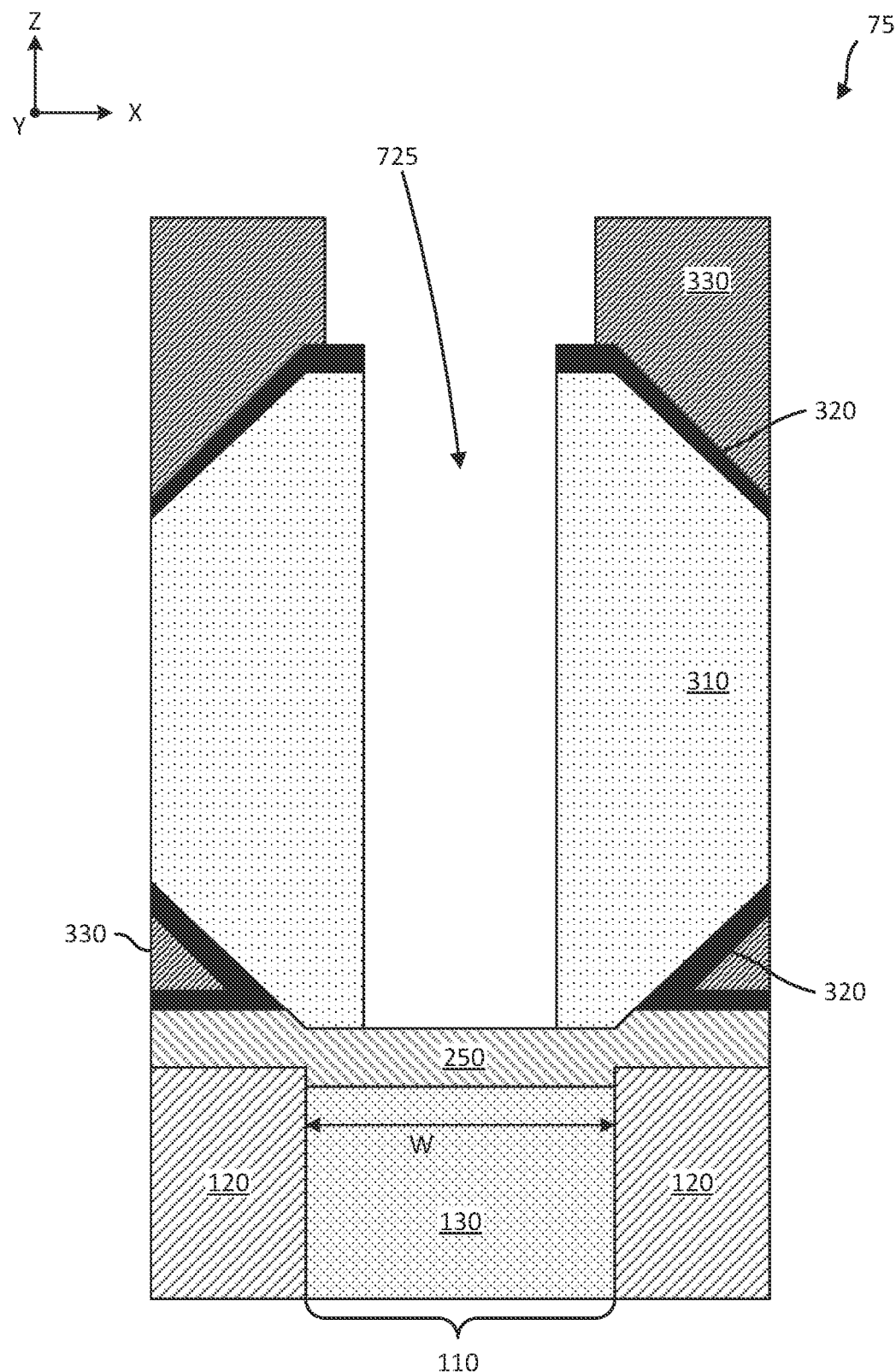
FIGS. 7C and 7D illustrate two orthogonal cross-sectional views of a GAAFET in an intermediate stage of fabrication, in accordance with another embodiment.
Figure 7D:
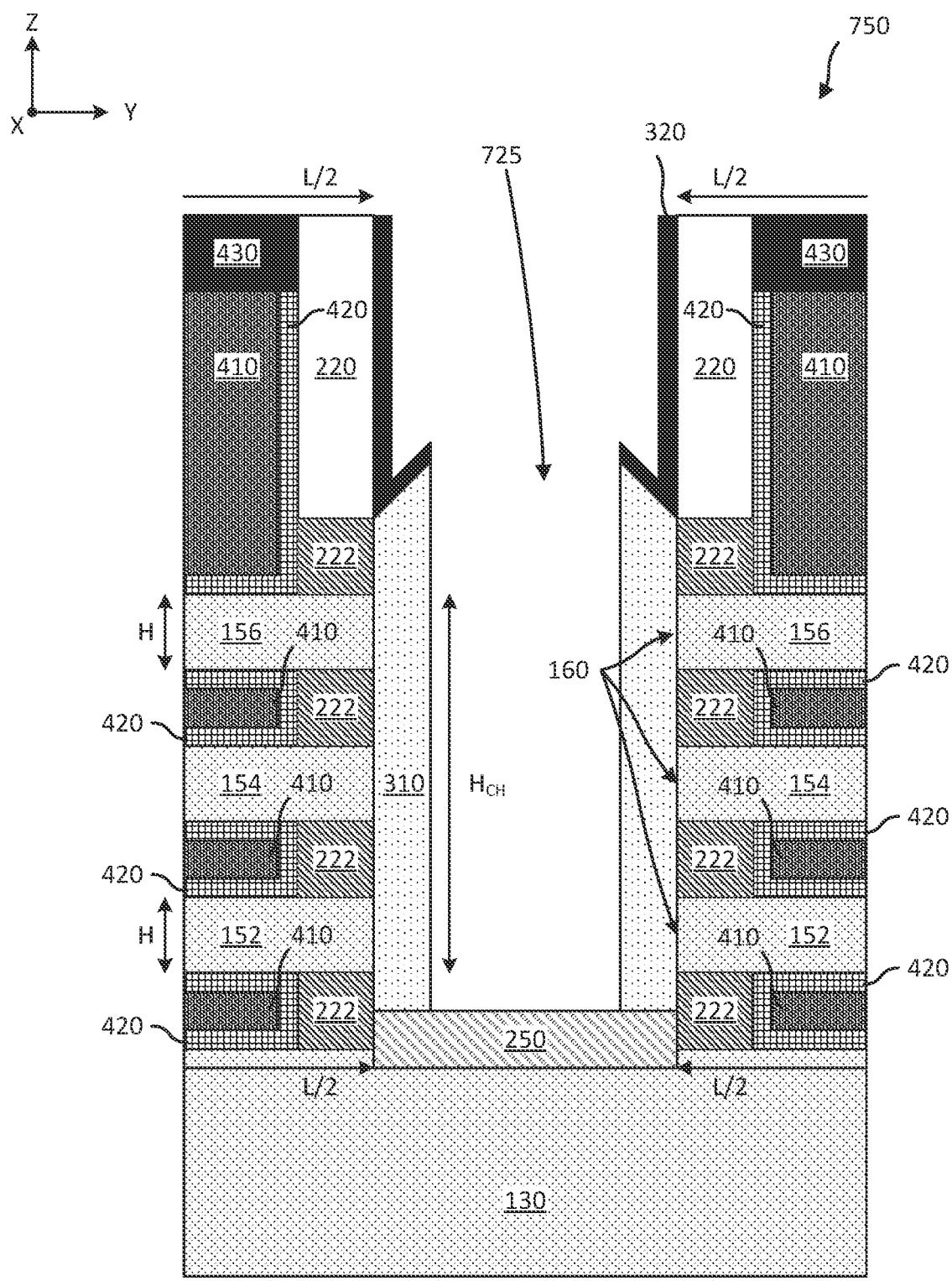

FIGS. 7C and 7D illustrate embodiments where the spacer 610 has been removed. Spacer 610 may be removed using, for example, an isotropic dry etch or a wet etch. The spacer 610 of the GAAFET structure 700 (illustrated in FIGS. 7A and 7B) has been removed to form a recessed contact opening 725 of a GAAFET structure 750, illustrated in FIGS. 7C and 7D. In the example embodiment, the spacer material for spacer 610 comprises silicon dioxide and may be removed using, for example, an isotropic HF vapor dry etch process or a buffered HF (BHF) wet etch process. After the processing for forming the recessed contact opening is completed, the contact metallization process steps are performed to form a metal plug filling the recessed contact openings, for example, the recessed contact openings 720 and 725. In embodiments where the spacer 610 comprises silicon nitride, removal of the spacer 610 would result in some collateral loss of other exposed layers comprising silicon nitride such as the SAC cap 430 and the sidewall structure 220. However, these layers may be formed to have thicknesses that are sufficiently greater than thickness of silicon nitride removed during the etch process used to remove the spacer 610.

Figure 8A:
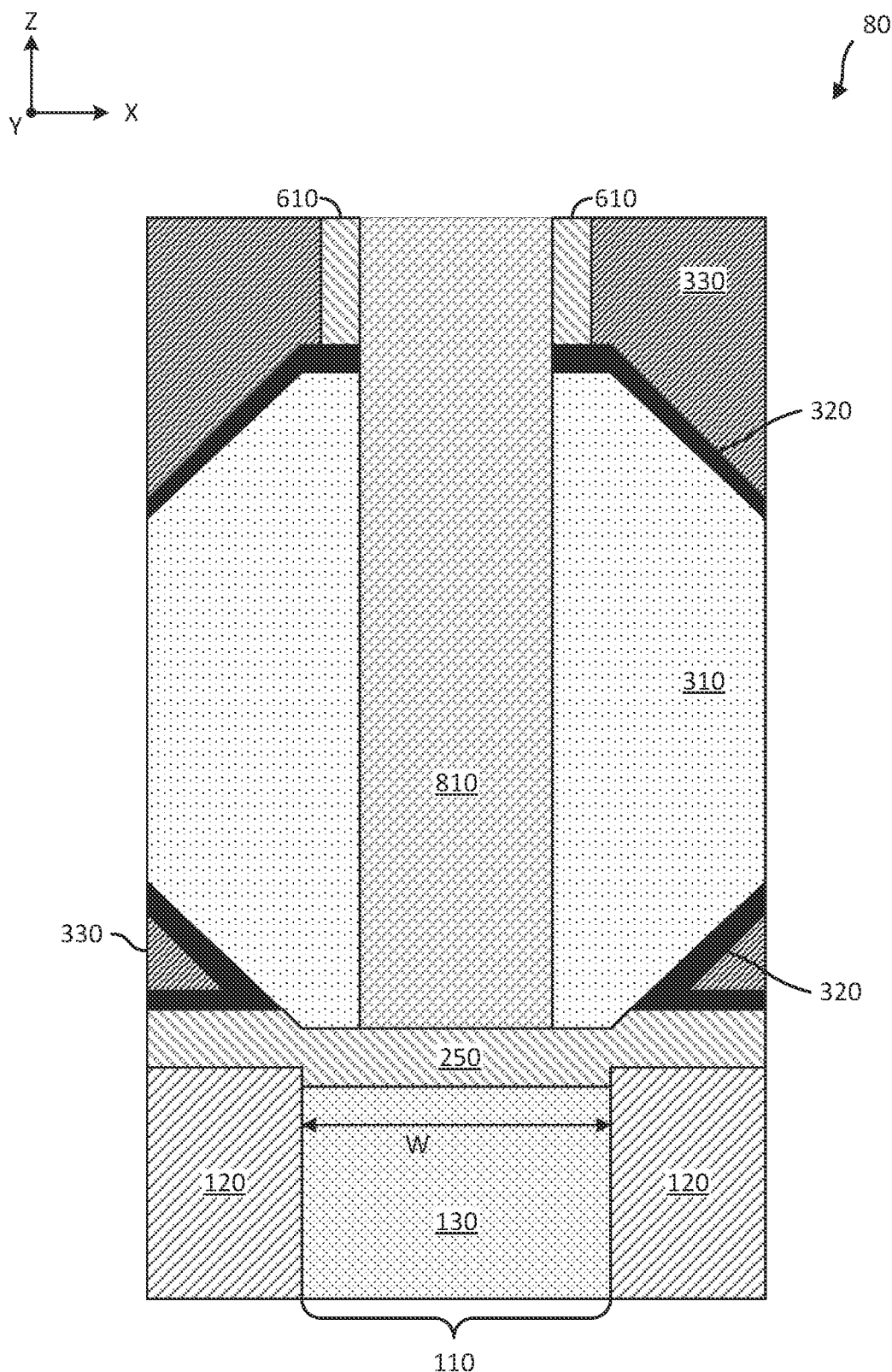
FIGS. 8A and 8B illustrate two orthogonal cross-sectional views of a GAAFET in an intermediate stage of fabrication, in accordance with an embodiment.
Figure 8B:
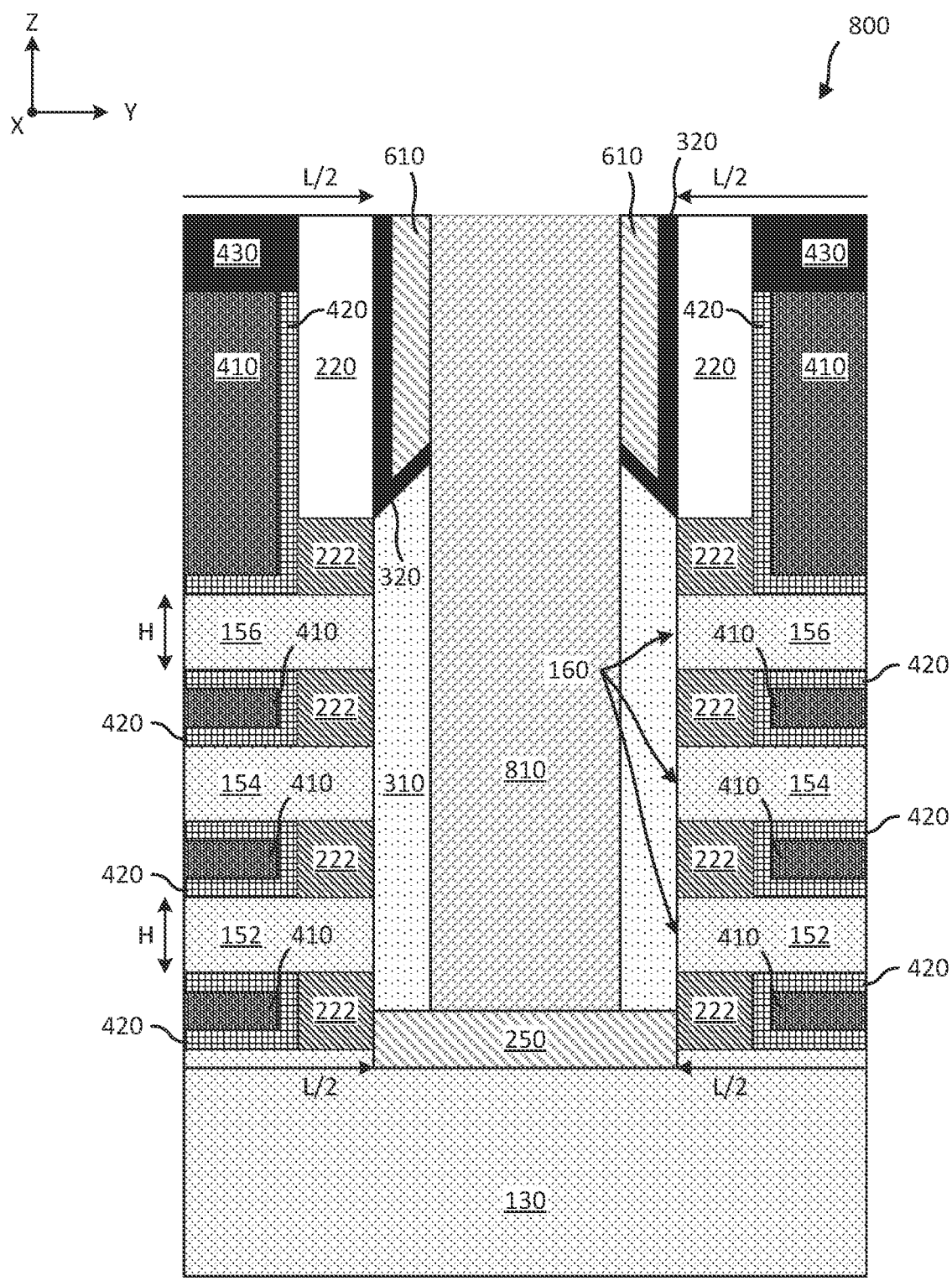
Figure 8C:
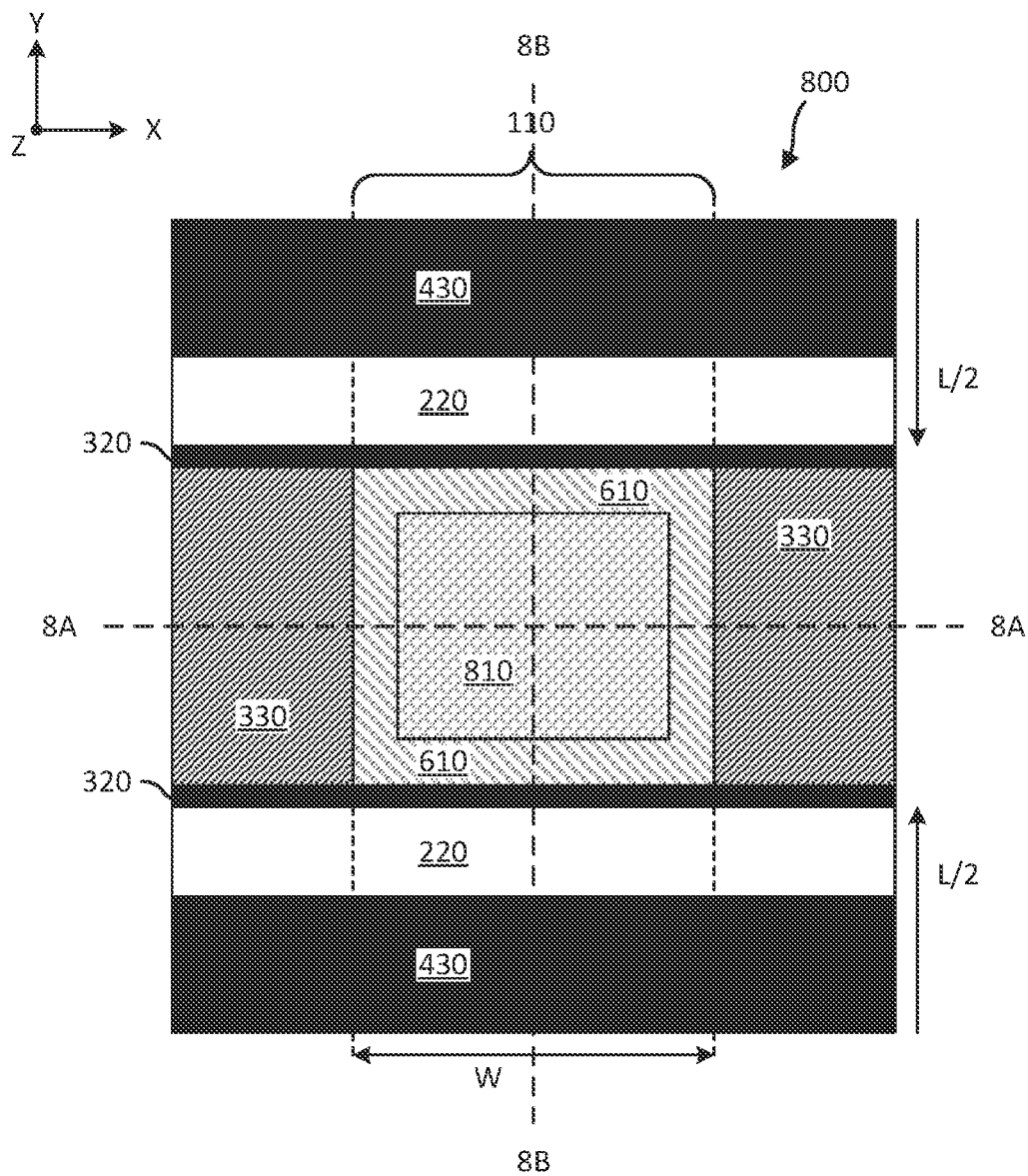
FIG. 8C illustrates a planar view of the GAAFET illustrated in FIGS. 8B-8C.
Figure 8D:
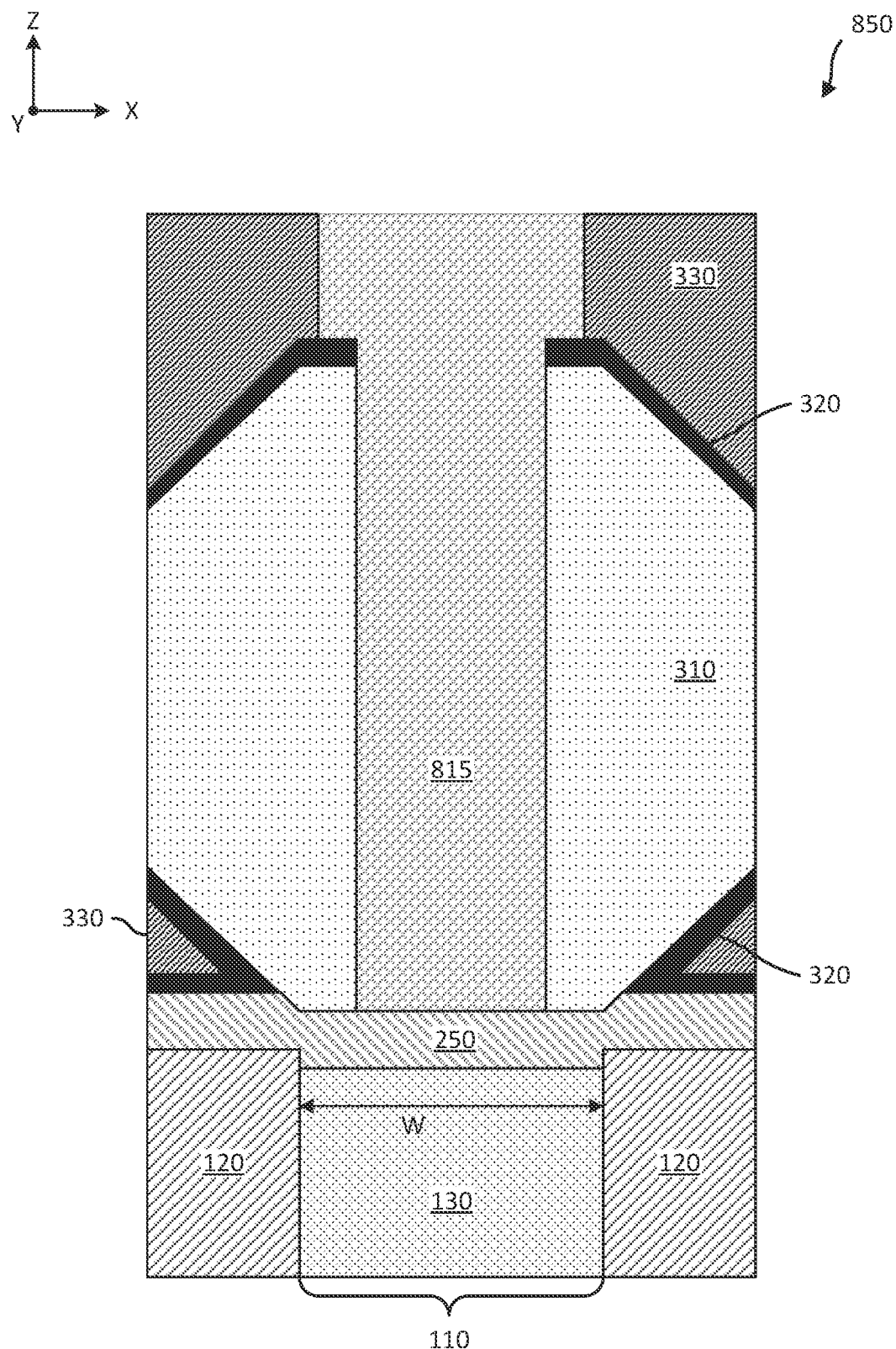
FIGS. 8D and 8E illustrate two orthogonal cross-sectional views of a GAAFET in an intermediate stage of fabrication, in accordance with another embodiment.
Figure 8E:
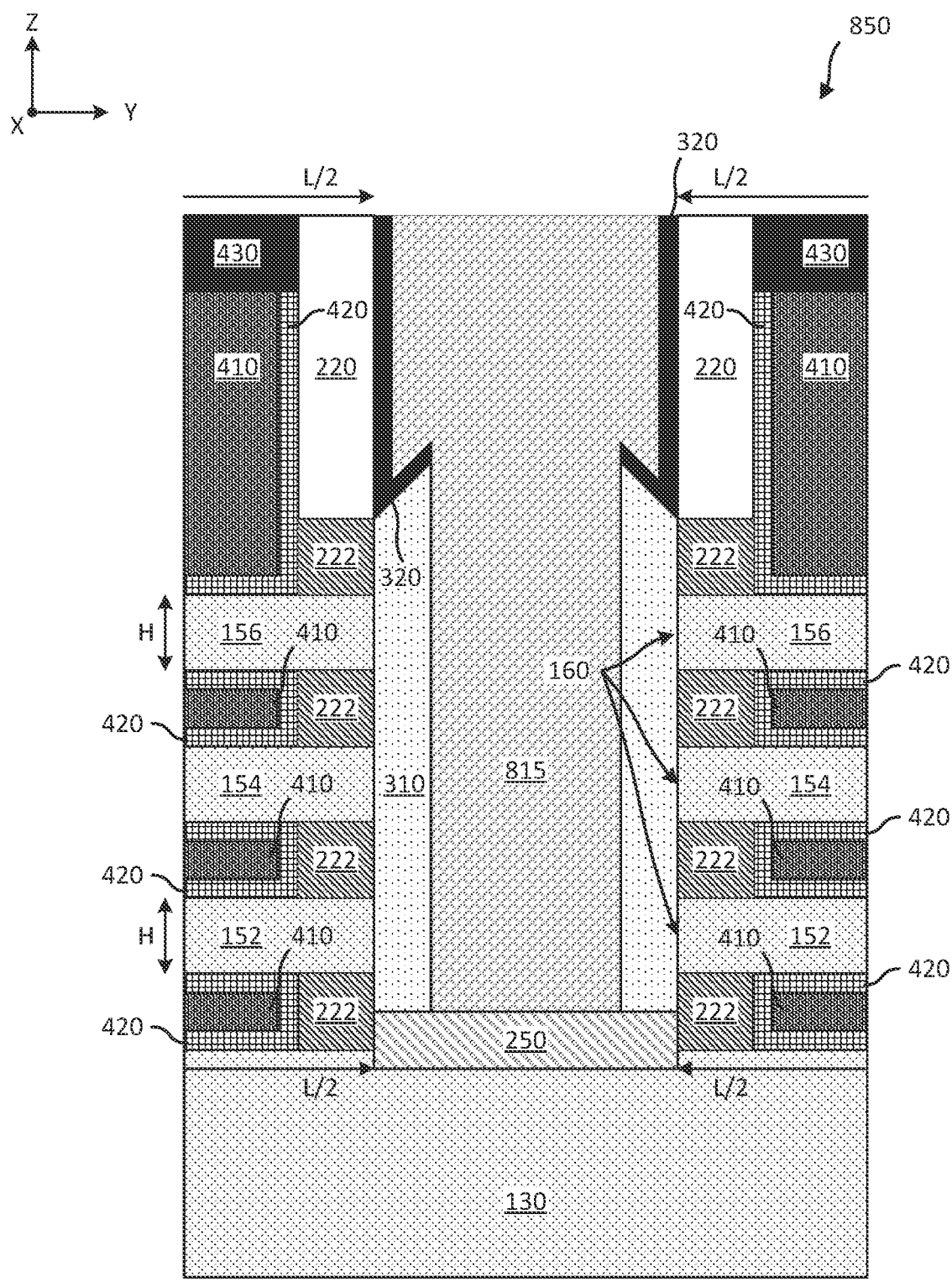
Figure 8F:
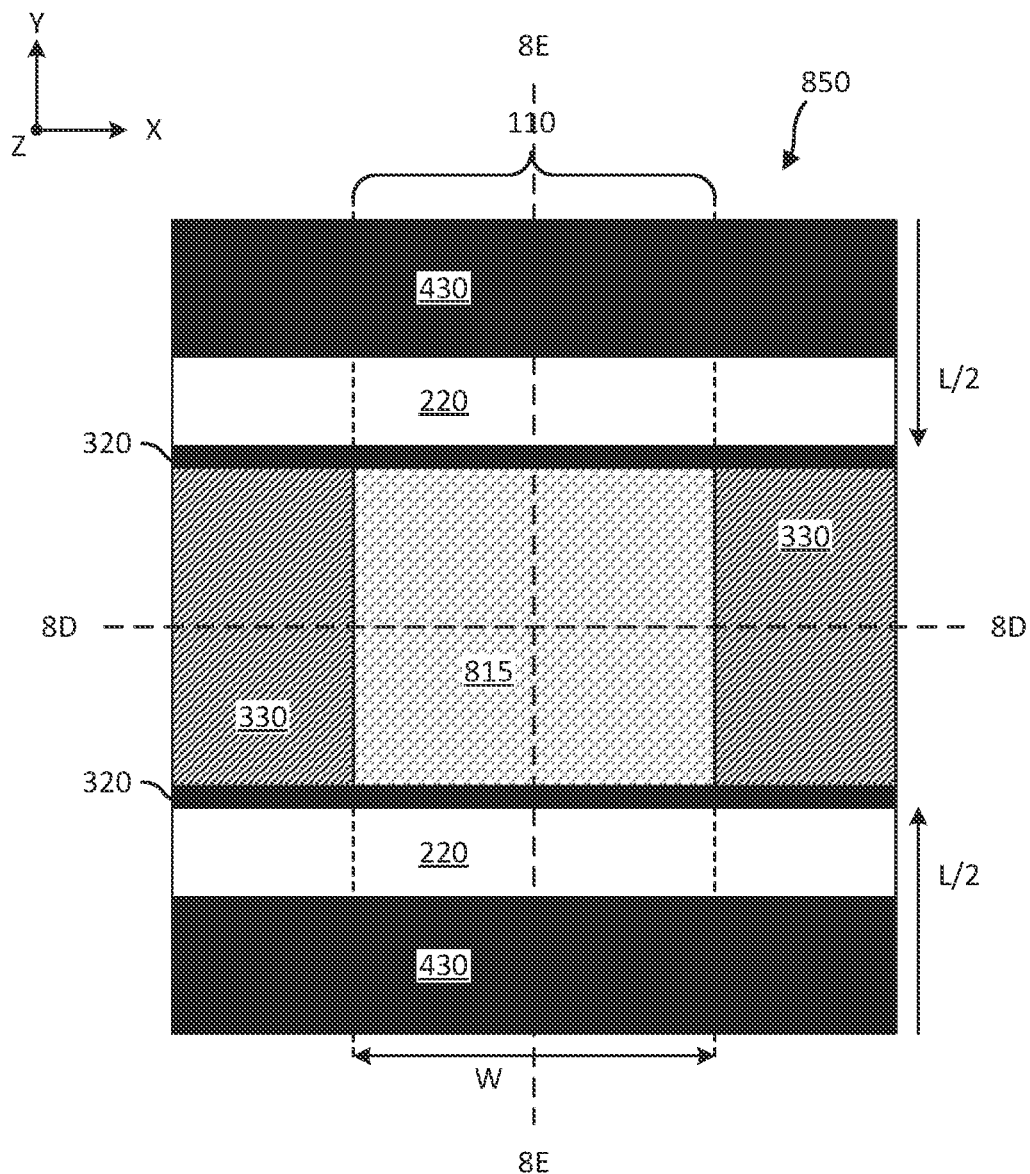
FIG. 8F illustrates a planar view of the GAAFET illustrated in FIGS. 8D-8E.

FIGS. 8A-8C illustrate a GAAFET structure 800, where the recessed contact opening 720 (see FIGS. 7A and 7B) has been filled by a metal plug 810, and FIGS. 8D-8F illustrate a GAAFET structure 850, where the recessed contact opening 725 (see FIGS. 7C and 7D) has been filled by a metal plug 815. FIGS. 8A and 8D are cross-sectional views in the X-Z planes of the GAAFET structures 800 and 850, respectively. FIGS. 8B and 8E are cross-sectional views in the Y-Z planes of the GAAFET structures 800 and 850, respectively. As seen in FIGS. 8A and 8D, which illustrate views in the X-Z plane, and in FIGS. 8B and 8E, which illustrate views in the Y-Z plane, the metal plugs 810 and 815 of the respective recessed contacts have an upper region and a lower region. The upper region is the region above the respective semiconductor S/D layers 310. In addition, the metal plugs 810 and 815 of the respective recessed contacts have a lower recessed metal region formed within the respective semiconductor S/D layers 310.

FIGS. 8C and 8F are planar views in the X-Y planes of the GAAFET structures 800 and 850, respectively. It is noted that the spacer 610 is present along the periphery of an upper portion of the metal plug 810 in the views illustrated in FIGS. 8A-8C. Since the spacer 610 was removed to form the recessed contact opening 725 (see FIGS. 7C and 7D), there is no spacer 610 seen in FIGS. 8D-8F.

The metal plugs 810 and 815 are formed by first depositing a conductive layer that overfills the recessed contact openings 720 and 750 (or the lowest level of a top surface of the conductive layer exceeds the highest level of a planarized surface of the interlayer dielectric comprising the contact ILD 330). The deposition process may include forming a conductive liner prior to completing filling the recessed contact openings 720 and 750. The conductive liner may be formed lining the sides and the bottom of the recessed contact openings 720 and 750, where the conductive liner includes a metal that can chemically react with the semiconductor to form a conductive metal silicide during a subsequent thermal process step. Examples of metals that can react with silicon, silicon-carbon alloy, and silicon-germanium alloy to form a metal silicide include titanium, cobalt, nickel, platinum, and ruthenium. In various embodiments, other metals used as a conductive liner include tantalum, titanium nitride, tantalum nitride, or a combination thereof. Metals used to fill the recessed contact openings 720 and 750 comprise tungsten, copper, cobalt, ruthenium, and the like.

After the contact metal deposition to form a conductive layer overfilling the recessed contact openings 720 and 750 is complete, a planarization process (e.g., a metal CMP process) is performed to remove excess conductive material from over the interlayer dielectric comprising the contact ILD 330 to form a substantially planar top surface comprising an insulating portion and a conductive portion, the conductive portion being the top surface of the metal plugs 810 and 815 in the openings 720 and 750, respectively, as illustrated in FIGS. 8A-8F.

In some embodiments, where the processing flow includes a thermal step to form a metal silicide, as mentioned above, the silicidation process steps may be performed after the contact metals have been deposited and prior to the planarization step to form the metal plugs 810 and 815 inlaid in the contact openings 720 and 725, respectively. In some other embodiments, the silicidation process steps may be performed after the conductive liner has been formed and before all the metal deposition steps to form the conductive layer filling the contact openings 720 and 725 have been completed.

Figure 9A:
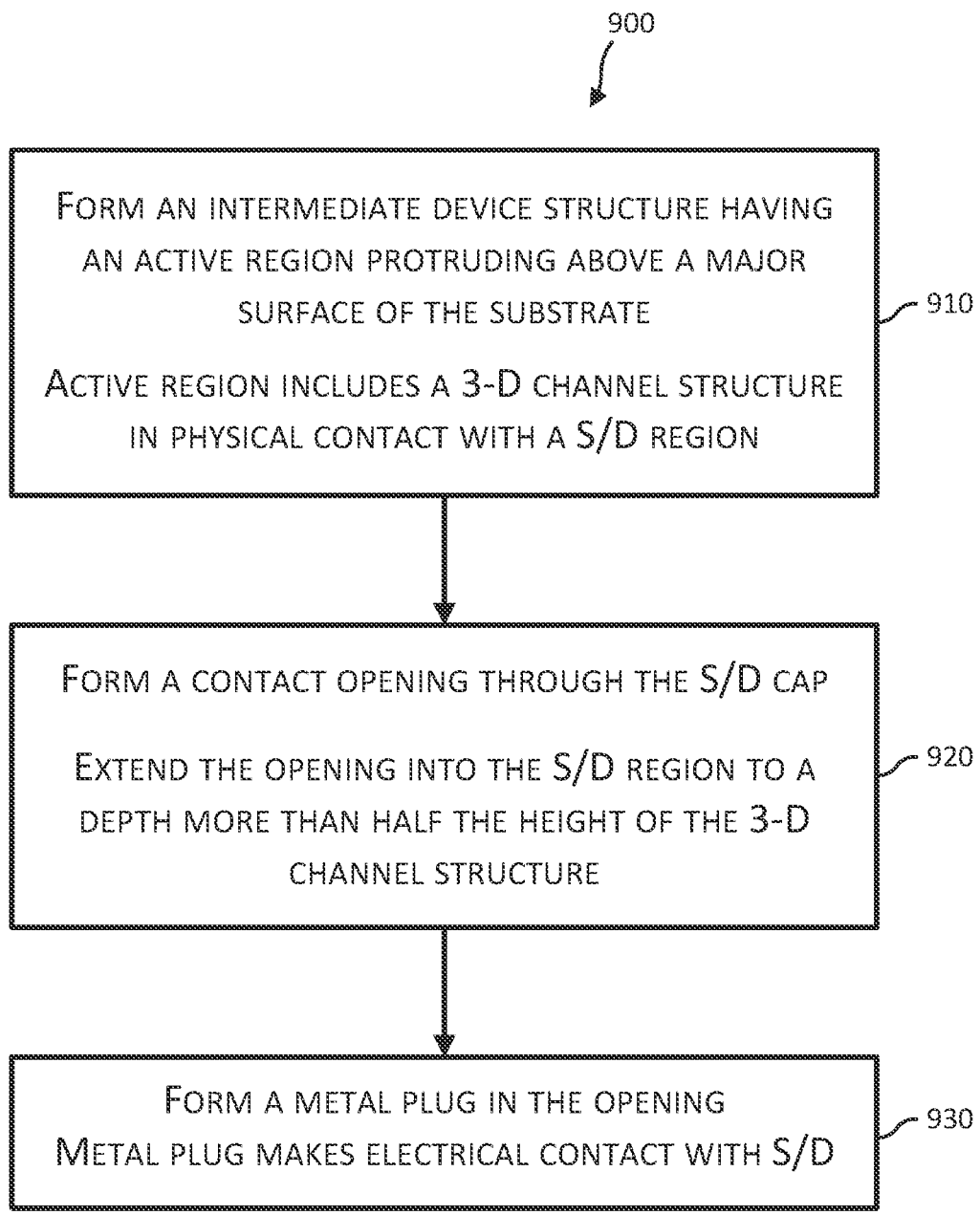
FIG. 9A illustrates a block diagram for a general method for forming recessed contacts to semiconductor S/D regions in accordance with an embodiment.

FIG. 9A illustrates a block diagram for a general method 900 for forming recessed contacts to semiconductor S/D regions.

As indicated in block 910, the method comprises forming in a substrate an active region, e.g., having four lateral sides, protruding vertically from the substrate. For example, as discussed with reference to FIGS. 1A-1B, the active region may be shaped like a fin as discussed for the semiconductor region 140 in the FinFET structure 100-1, or the heterostructure 150 in the GAAFET structure 100-2. Subsequently, a portion of the active region is formed to include a semiconductor S/D region 310 covered by an insulating contact ILD 330, as discussed with reference to FIGS. 3A and 3B.

In block 920, a recessed contact opening is formed (e.g., the recessed contact openings 720 and 725, as discussed with reference to FIGS. 5A-7D). The recessed contact opening has an upper region formed through the insulating layers above the S/D region and extends further into a lower region formed in the semiconductor S/D region (e.g., the S/D region 310, as discussed with reference to FIGS. 5A-7D). A bottom of the opening is placed at a depth from a major surface of the S/D region that exceeds half the height, $H_{CH}$, of the 3-D channel structure (e.g., the 3-D channel structure 160).

As indicated in block 930, the recessed contact opening formed in block 920 is filled by a metal plug inlaid in the recessed contact opening (e.g., the metal plugs 810 and 815, as discussed with reference to FIGS. 8A-8F). An upper portion of the metal plug fills the upper portion of the recessed contact and a lower portion of the metal plug forms a recessed metal region having a periphery in electrical contact with the S/D region.

Figure 9B:
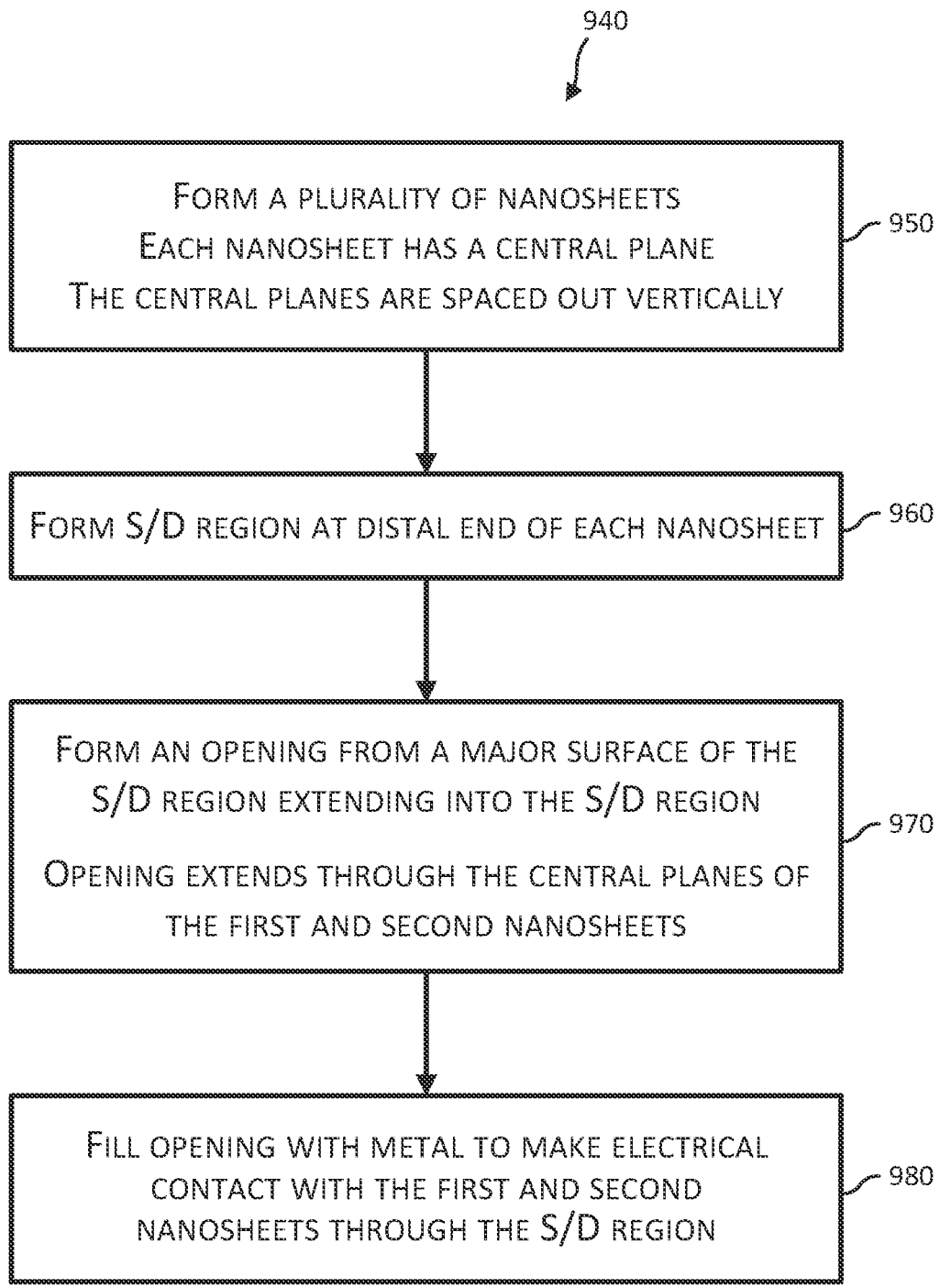
FIG. 9B illustrates a block diagram for a general method for forming recessed contacts to semiconductor S/D regions of 3-D FET's in accordance with an embodiment.

FIG. 9B illustrates a block diagram for a general method 940 for forming recessed contacts to semiconductor S/D regions of 3-D FET's (e.g., the S/D region 310 in the GAAFET structure 400, as discussed with reference to FIG. 4).

As indicated in block 950 in FIG. 9B, a method of forming a semiconductor device includes forming a plurality of nanosheets (e.g. nanosheets 152, 154, and 156 in a GAAFET structure 400, as discussed with reference to FIG. 4). The plurality of nanosheets includes a first nanosheet (e.g., nanosheet 156) and a second nanosheet (e.g., nanosheet 154). Each of the plurality of nanosheets has a horizontal central plane, for example, the first horizontal central plane HP1 passes through the first nanosheet 156, the second horizontal central plane HP2 passes through the second nanosheet 154, and the third horizontal central plane HP3 passes through the third nanosheet 152. The horizontal central planes, HP1, HP2, and HP3, are spaced apart from one another in a vertical direction.

As indicated in block 960 in FIG. 9B, the method 940 includes forming a source-drain (S/D) region (e.g., the S/D region 310 in the GAAFET structure 400 in FIG. 4) at a distal end of each of the plurality of nanosheets (e.g. nanosheets 152, 154, and 156 in a GAAFET structure 400, as discussed with reference to FIG. 4).

In block 970 of the block diagram for the method 940 an opening is formed extending from a major surface of the S/D region into the S/D region (e.g., the openings 720 and 725, as discussed with reference to FIGS. 5A-7D). The opening may be extending through the horizontal central planes of the first and the second nanosheets (e.g., the nanosheets 156 and 154) into the S/D region.

As indicated in block 980, the method 940 includes filling the opening with a metal to make electrical contact with the first and the second nanosheets through the S/D region. For example, the metallic features 810 and 815 make electrical contact with the first and the second nanosheets 156 and 154 through the S/D region 310, as discussed with reference to FIGS. 8A-8F.

The embodiments of the recessed S/D contacts described above provide contact structures and methods that provide low S/D series resistance in 3-D FET's such as FinFET's and GAAFET's. By using these embodiments, densely packed 3-D FET's may be achieved without a high penalty in increased parasitic S/D resistance in series with the 3-D channel structures. The recessed contact includes a vertical metallic feature embedded in the semiconductor S/D, which helps distribute the transistor current more evenly vertically across the fin of a FinFET and among the channel nanosheets of the multi-tiered 3-D channel structure of the GAAFET.

In addition, the inventors infer from the geometry of the combined 3-D FET and recessed S/D contact structure and from known properties of deposited films (e.g., the coefficient of thermal expansion) that, in various embodiments, the materials and dimensions of the recessed contact may be engineered to adjust the strain in the epitaxially-grown S/D region to enhance channel mobility of some of the GAAFET's. Yet another benefit of the recessed contact is that, by reducing the S/D resistance, the recessed contact reduces non-ideality of the transistor I-V, thus rendering higher accuracy of compact models of the FET. Compact models of FET's are computer simulation models used in computer-aided design (CAD) tools for designing IC's. Standard compact models may not accurately reproduce non-idealities in transistor I-V characteristics introduced by high S/D resistance, particularly, nonuniform or distributed S/D resistance.

Example 1. A method of forming a semiconductor device, the method includes: forming, in a substrate, an active region protruding vertically from a major surface of the substrate, the active region including a semiconductor source-drain (S/D) region and a first 3-D channel structure, the S/D region physically contacting the first 3-D channel structure, and forming an opening extending into the S/D region, the opening having a depth greater than half of a height of the first 3-D channel structure; and forming a metallic plug in the opening, the metallic plug making electrical contact with the S/D region.

Example 2. The method of example 1, where forming the active region includes forming a first sacrificial gate stack over the first 3-D channel structure, where forming the metallic plug includes forming a portion of the metallic plug along a sidewall of the first sacrificial gate stack.

Example 3. The method of one of examples 1 or 2, where the active region includes a second 3-D channel structure, the S/D region physically contacting the second 3-D channel structure.

Example 4. The method of one of examples 1 to 3, further including: forming a first sacrificial gate stack over the first 3-D channel structure and a second sacrificial gate stack over the second 3-D channel structure, where forming the metallic plug includes forming a portion of the metallic plug along a sidewall of the first sacrificial gate stack and a sidewall of the second sacrificial gate stack.

Example 5. The method of one of examples 1 to 4, where forming the active region includes forming an insulating region over a portion of the major surface of the substrate.

Example 6. The method of one of examples 1 to 5, where forming the opening exposes a surface of the insulating region.

Example 7. The method of one of examples 1 to 6, where the S/D region is covered by an insulating contact interlayer dielectric (ILD), and where forming the opening includes: performing a first etch process to form a first opening in the contact ILD, the first opening exposing a contact etch stop layer covering a surface of the S/D region; after completing the first etch process, forming a spacer over sidewalls of the first opening; performing a second etch process to remove the exposed contact etch stop layer; and performing a third etch process to extend the first opening into the S/D region.

Example 8. The method of one of examples 1 to 7, where the spacer includes silicon oxide, or silicon nitride.

Example 9. The method of one of examples 1 to 8, further including: after completing the third etch process, selectively removing the spacer formed in the first opening.

Example 10. The method of one of examples 1 to 9, further including: siliciding a portion of the S/D region exposed by the opening.

Example 11. The method of one of examples 1 to 10, where the siliciding forms a metal silicide including titanium silicide, cobalt silicide, nickel silicide, platinum silicide, or ruthenium silicide.

Example 12. A method of forming a semiconductor device, the method includes: forming a plurality of nanosheets including a first nanosheet and a second nanosheet, each of the plurality of nanosheets having a horizontal central plane and spaced apart from one another in a vertical direction; forming a source-drain (S/D) region at a distal end of each of the plurality of nanosheets; from a major surface of the S/D region, forming an opening extending through the horizontal central planes of the first and the second nanosheets into the S/D region; and filling the opening with a metal to make electrical contact with the first and the second nanosheets through the S/D region.

Example 13. The method of example 12, where filling the opening with a metal includes filling with tungsten, copper, cobalt, ruthenium, titanium, tantalum, titanium nitride, tantalum nitride, or a combination thereof.

Example 14. The method of one of examples 12 or 13, where filling the opening with a metal includes forming a conductive liner along sides and a bottom of the opening prior to filling the opening with the metal.

Example 15. The method of one of examples 12 to 14, where the conductive liner includes titanium, titanium silicide, cobalt, cobalt silicide, nickel, nickel silicide, platinum, platinum silicide, ruthenium, ruthenium silicide, titanium nitride, tantalum, tantalum nitride or a combination thereof.

Example 16. A semiconductor device includes: an active region protruding vertically from a major surface of a substrate, the active region including a semiconductor source-drain (S/D) region and a first 3-D channel structure, the S/D region physically contacting the first 3-D channel structure, and an opening (720) extending into the S/D region, a bottom of the opening being below the first 3-D channel structure; and a metallic plug disposed in the opening, the metallic plug being electrically coupled to the S/D region.

Example 17. The device of example 16, where the first 3-D channel structure is a single fin.

Example 18. The device of one of examples 16 or 17, where the first 3-D channel structure includes a first plurality of channel regions, each of the first plurality of channel regions including a nanosheet.

Example 19. The device of one of examples 16 to 18, where the S/D region includes an epitaxially grown semiconductor region.

Example 20. The semiconductor device of one of examples 16 to 19, further including an insulating region disposed below the S/D region, where the S/D region includes an epitaxially grown semiconductor region, and where a bottom of the metal plug is in physical contact with the insulating region.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a semiconductor device, the method comprising:
    forming, in a substrate, an active region protruding vertically from a major surface of the substrate, the active region comprising a semiconductor source-drain (S/D) region and a stack of 3-D channel structures, the stack of 3-D channel structures comprising a first 3-D channel structure, the first 3-D channel structure being closest to the substrate of the stack of 3-D channel structures, the S/D region physically contacting the first 3-D channel structure, and
    forming an opening extending into the S/D region, the opening extending closer to the substrate than a bottom surface of the first 3-D channel structure; and
    forming a metallic plug in the opening, the metallic plug making electrical contact with the S/D region.

2. The method of claim 1, wherein forming the active region comprises forming a first sacrificial gate stack over the first 3-D channel structure, wherein forming the metallic plug comprises forming a portion of the metallic plug along a sidewall of the first sacrificial gate stack.

3. The method of claim 1, wherein the stack of 3-D channel structures comprises a second 3-D channel structure over the first 3-D channel structure, the S/D region physically contacting the second 3-D channel structure.

4. The method of claim 3, further comprising:
    forming a first sacrificial gate stack over the first 3-D channel structure and a second sacrificial gate stack over the second 3-D channel structure, wherein forming the metallic plug comprises forming a portion of the metallic plug along a sidewall of the first sacrificial gate stack and a sidewall of the second sacrificial gate stack.

5. The method of claim 1, wherein forming the active region comprises forming an insulating region over a portion of the major surface of the substrate.

6. The method of claim 5, wherein forming the opening exposes a surface of the insulating region after forming the S/D region.

7. The method of claim 1, wherein the S/D region is covered by an insulating contact interlayer dielectric (ILD), and wherein forming the opening comprises:
    performing a first etch process to form a first opening in the contact ILD, the first opening exposing a contact etch stop layer covering a surface of the S/D region;
    after completing the first etch process, forming a spacer over sidewalls of the first opening;
    performing a second etch process to remove the exposed contact etch stop layer; and
    performing a third etch process to extend the first opening into the S/D region.

8. The method of claim 7,
    wherein the spacer comprises silicon oxide, or silicon nitride.

9. The method of claim 7, further comprising: after completing the third etch process, selectively removing the spacer formed in the first opening.

10. The method of claim 1, further comprising:
    siliciding a portion of the S/D region exposed by the opening.

11. The method of claim 10, wherein the siliciding forms a metal silicide comprising titanium silicide, cobalt silicide, nickel silicide, platinum silicide, or ruthenium silicide.

12. A method of forming a semiconductor device, the method comprising:
    forming a plurality of nanosheets comprising a first nanosheet and a second nanosheet, each of the plurality of nanosheets having a horizontal central plane and spaced apart from one another in a vertical direction;
    forming a source-drain (S/D) region at a distal end of each of the plurality of nanosheets;
    from a major surface of the S/D region, forming an opening extending through the horizontal central planes of the first and the second nanosheets to a bottom surface of the S/D region; and
    filling the opening with a metal to make electrical contact with the first and the second nanosheets through the S/D region.

13. The method of claim 12, wherein filling the opening with a metal comprises filling with tungsten, copper, cobalt, ruthenium, titanium, tantalum, titanium nitride, tantalum nitride, or a combination thereof.

14. The method of claim 12, wherein filling the opening with a metal comprises forming a conductive liner along sides and a bottom of the opening prior to filling the opening with the metal.

15. The method of claim 14, wherein the conductive liner comprises titanium, titanium silicide, cobalt, cobalt silicide, nickel, nickel silicide, platinum, platinum silicide, ruthenium, ruthenium silicide, titanium nitride, tantalum, tantalum nitride or a combination thereof.

16. A semiconductor device comprising:
    an active region protruding vertically from a major surface of a substrate, the active region comprising a semiconductor source-drain (S/D) region and a first 3-D channel structure, the S/D region physically contacting the first 3-D channel structure, and
    an opening extending through the S/D region, a bottom of the opening being below the first 3-D channel structure; and
    a metallic plug disposed in the opening, the metallic plug being electrically coupled to the S/D region.

17. The device of claim 16, wherein the first 3-D channel structure is a single fin.

18. The device of claim 16, wherein the first 3-D channel structure comprises a first plurality of channel regions, each of the first plurality of channel regions comprising a nanosheet.

19. The device of claim 16, wherein the S/D region comprises an epitaxially grown semiconductor region.

20. The semiconductor device of claim 16, further comprising an insulating region disposed below the S/D region, wherein the S/D region comprises an epitaxially grown semiconductor region, and wherein a bottom of the metal plug is in direct physical contact with the insulating region.

* * * * *

UNITED STATES PATENT AND TRADEMARK OFFICE
CERTIFICATE OF CORRECTION

| | | |
|---|---|---|
| PATENT NO. | : 12,211,911 B2 | Page 1 of 1 |
| APPLICATION NO. | : 17/494460 | |
| DATED | : January 28, 2025 | |
| INVENTOR(S) | : Metz et al. | |

It is certified that error appears in the above-identified patent and that said Letters Patent is hereby corrected as shown below:

On the Title Page

Column 1, Item (72), in "Inventors", Line 3, delete "Allbany," and insert -- Albany, --, therefor.

Signed and Sealed this
Twenty-second Day of April, 2025

Coke Morgan Stewart
*Acting Director of the United States Patent and Trademark Office*